United States Patent [19]

Lautzenhiser

[11] Patent Number: 5,091,706

[45] Date of Patent: Feb. 25, 1992

[54] PHASE LOCKED LOOP WITH D.C. MODULATION AND USE IN RECEIVER

[75] Inventor: Lloyd L. Lautzenhiser, Nobel, Canada

[73] Assignee: Emhiser Research Limited, Parry Sound, Canada

[21] Appl. No.: 528,654

[22] Filed: May 24, 1990

[51] Int. Cl.⁵ ............... H03C 3/09; H03L 7/197; H04B 1/26

[52] U.S. Cl. .................... 332/127; 331/23; 331/25; 332/128; 455/113; 455/209; 455/260; 455/346

[58] Field of Search ............ 332/127, 128, 144, 146; 329/325, 326; 331/1 A, 23, 25, 30; 455/208, 209, 260, 316, 113, 119; 375/81, 44, 120

[56] References Cited

U.S. PATENT DOCUMENTS

| | | | |
|---|---|---|---|
| 3,346,814 | 10/1967 | Haggai | 329/325 |
| 3,622,913 | 11/1971 | Shipley | 331/18 X |
| 3,805,192 | 4/1974 | Ocnaschek et al. | 332/127 |
| 4,516,083 | 5/1985 | Turney | 331/1 A |
| 4,653,117 | 3/1987 | Heck | 455/316 X |
| 4,837,853 | 6/1989 | Heck | 329/325 X |

Primary Examiner—Siegfried H. Grimm
Attorney, Agent, or Firm—Wendell E. Miller

[57] ABSTRACT

A D.C. modulated phase locked oscillator (60, 80, 100, 140, 160, or 190) and a radio frequency receiver (200) that utilizes the D.C. modulated phase locked oscillator (60, 80, 100, 140, 160, or 190) both include a phase locking oscillator (70, 90, 128, 180, or 192) and a D.C. modulator (72, 92, 130, 156, 182, or 194). Both a forward path (14) and a feedback path (16) are D.C. modulated. D.C. modulation of the feedback path (16) optionally includes changing the frequency in the feedback path (16) as a function of the frequency of a modulation oscillator (64), changing the frequency in the feedback path (16) by a plurality of pulses for each cycle of the modulation oscillator (64), removing pulses from the feedback path (16), adding pulses to the feedback path (16), dividing the frequency in the feedback path (16) by higher and lower dividing ratios, preventing one cycle in the feedback path (16) from developing a "high" in the feedback path (16), and holding a "high" in the feedback path (16) between two adjacent pulses.

72 Claims, 12 Drawing Sheets

PHASE LOCKED LOOP WITH D.C. MODULATION AND USE IN RECEIVER

BACKGROUND OF THE INVENTION

1. Field of the Invention

The present invention relates generally to phase locked oscillators and voltage controlled crystal oscillators. More particularly, the present invention relates to a phase locked loop with D.C. modulation, and uses of the D.C. modulated phase locked loop in such electrical devices as single frequency transmitters and receivers, and channelized transmitters and receivers.

2. Description of the Related Art

The frequency of radio frequency voltage controlled oscillators (RF VCO) has been closely controlled by phase locking a feedback signal from the RF VCO to a crystal controlled reference oscillator (XO). A phase detector has been used to determine the phase difference between the feedback signal and a crystal controlled reference frequency; and an integrator has been used to summate the phase difference and to control the frequency of the RF VCO oscillator in accordance with the summated phase difference.

Improvements taught by the prior art over the basic phase locked oscillator include the use of prescalers to provide a feedback signal having a lower frequency than the RF VCO, thereby lowering the required frequency of the controlling circuitry. Prior art improvements over the basic circuitry also include the use of a dual modulus divider to channelize the output frequency by dividing the feedback by higher and lower dividing ratios in a technique known as pulse swallowing. That is, channelizing is accomplished by swallowing, or removing, pulses in the feedback path.

While phase locked oscillators have provided a frequency output that drifts very little, a significant problem has been in trying to frequency modulate the output on a D.C. basis.

One attempt at D.C. modulating the frequency output of a phase locked oscillator has been to use a voltage controlled crystal oscillator (VCXO) in place of a crystal controlled reference oscillator (XO), and to simultaneously modulate the RF VCO as well as the VCXO. The problems with this approach have been non-linearities in the VCXO, limited frequency deviation, limited frequency response of modulation, and significantly increased frequency drift as a function of both time and temperature.

In stark contrast to the limitations of the prior art, the present invention provides highly linear D.C. modulation of a RF VCO together with very little frequency drift as well as almost unlimited deviation and frequency response.

More particularly, the present invention provides both single frequency and channelized phase locked loops that are capable of D.C. modulation.

SUMMARY OF THE INVENTION

In the present invention, a D.C. modulated phase locked RF VCO includes a phase locked loop with a forward path, an RF VCO in the forward path that produces an output, a feedback path that is connected to the output, a crystal controlled reference oscillator, a phase detector that is connected to the crystal controlled reference oscillator and that is connected to both the feedback path and the forward path, and an integrator in the forward path that controls the frequency of the voltage controlled oscillator in response to integrated differences in the phase between said reference oscillator and the frequency in the feedback path.

The means for D.C. modulating the RF VCO includes a dual modulus divider that is interposed into the feedback path, and a modulation oscillator that is connected to the dual modulus divider and that causes the dual modulus divider to divide by a higher dividing ratio for each cycle of the audio oscillator. Preferably, the modulation oscillator is a voltage controlled audio oscillator (AF VCO).

Therefore, the dual modulus divider cooperates with the voltage controlled audio oscillator to remove one pulse from the feedback path for each cycle of the audio oscillator. The RF VCO is then caused by the loop to increase its output frequency to exactly compensate for these removed pulses. The result is that the frequency of the audio frequency oscillator is added to the frequency of the oscillator. D.C. modulation of the output is therefore achieved by D.C. modulating the voltage input to the voltage controlled audio frequency oscillator.

Optionally, RF VCO is D.C. modulated substantially simultaneously with modulating of the feedback path in order to increase the frequency response of the loop.

Further, the present invention includes means for synchronizing the changing of dividing ratios in accordance with completion of dividing at one of the ratios. In one embodiment, this means for synchronizing includes first and second flip-flops, and an OR gate. In another embodiment, this means for synchronizing includes a shift register, an OR gate, an AND gate, and an inverter.

In the embodiment using the shift register, the combination of the shift register with the voltage controlled audio oscillator and the dual modulus divider provides a system in which a plurality of pulses are removed from the feedback path for each cycle of the audio oscillator.

Optionally, a prescaling divider is used in the feedback path to reduce the frequency of the feedback signal prior to dividing the feedback signal by the dual modulus divider. This addition allows a higher frequency oscillator to be similarly controlled without exceeding the frequency limitations of the dual modulus divider.

Further, the use of a prescaling divider reduces the required frequency of the audio oscillator for any given desired range of frequency modulation.

In another embodiment, suitable primarily for lower frequencies, the dual modulus divider is omitted, and a pair of bi-stable multivibrators, or flip-flops, are used to synchronize the modulation oscillator with the pulses in the feedback path, and a resistor and a diode are used to remove one pulse from the feedback path for each cycle of the modulation oscillator, or even to effectively remove as many as hundreds of pulses from the feedback path for each cycle of the modulation oscillator.

In embodiments using a dual modulus divider, by changing the normal state of the dual modulus divider to divide at the higher dividing ratio, pulses are added to the feedback path rather than being removed.

The exceptionally low frequency drift of the present invention is attributable to the inherent stability of the crystal controlled reference oscillator, and the low frequency drift of the modulation oscillator which, preferably, is in the audio frequency range.

The proliferation of uses for various frequency bands has resulted in crowding of the bands, and in an accompanying need to increase the number of channels in a given band. However, the limitation in the number of channels that can be accomplished depends to some measure upon the band width that must be allocated to expected frequency drift over time and temperature.

Until recently, for military communication bands, a frequency drift of +/−0.003 percent was allowed, but now specifications have been tightened to allow only +/−0.002 percent.

Assuming a frequency drift of +/−0.003 percent in the 2200 to 2400 MHz band, and assuming the mid point of the band, this allowable frequency drift could result in a drift of +/−69 kHz or a total drift of 138 kHz.

The present invention provides both transmitters and receivers in which not only are drift specifications of +/−0.002 percent readily attainable, but also the transmitters and receivers of the present invention can be manufactured to hold the frequency drift within +/−0.001 percent should this specification be further tightened.

Since the frequency drift of voltage controlled oscillators is a smaller percentage with lower frequency designs, the frequency drift of the RF VCO is reduced by dividing the feedback frequency by a larger dividing ratio and using a lower modulation frequency, even though the effect of each cycle of the modulation frequency, and the drift of the modulation oscillator, is multiplied by the dividing ratio.

However, a reduced frequency in the feedback path results in a lower frequency response of the system. The use of a shift register also reduces the required frequency of the audio oscillator; but it does not deteriorate the frequency response, as does the use of a prescaling divider.

Without regard to frequency response, in preferred embodiments the present invention provides almost instantaneous modulation of the output in response to a modulation signal, since the forward path is modulated as well as the feedback path. Therefore, while the time to phase lock is dependent upon the frequency in the feedback path, the time to D.C. modulate the output is almost instantaneous without regard to the frequency in the feedback path.

Optionally, the present invention utilizes two separate means for controlling the dual modulus divider. One of these controlling means is the D.C. modulating means of the audio frequency voltage controlled oscillator; and the other controlling means provides means for channelizing the output.

That is, the dual modulus divider is controlled to remove pulses in the feedback path to provide D.C. modulation of the output; and the dual modulus divider is separately controlled to remove pulses in the feedback path at a rate in which the output is shifted to a given frequency channel.

The synchronizer of the present invention prevents interruption of the control of the dividing ratios of the dual modulus divider by one of the controlling means while the other controlling means is controlling the dual modulus divider.

The D.C. modulated oscillator of the present invention is usable in, and is a subcombination of, a radio frequency receiver of the present invention.

The radio frequency receiver includes an input stage for receiving a frequency modulated input signal; an oscillator for producing a phase locked output signal; a demodulator, including the oscillator, and being operatively connected to the input stage, for producing the D.C. component of the frequency modulated input signal; and a modulator, being operatively connected to the demodulator and to the oscillator, for D.C. modulating the phase locked output in response to the D.C. component.

The radio frequency receiver of the present invention is channelized and/or includes any or all of the features of the D.C. modulated oscillator of the present invention.

The apparatus and methods of the present invention are further described in the following aspects of the invention.

In a first aspect of the present invention, an electrical device is provided which comprises phase locking oscillator means, including a loop with a forward path that includes a comparator and a variable frequency oscillator that is operatively connected to the comparator, and with a feedback path that feeds a feedback frequency from the variable frequency oscillator back to an input of the comparator, for producing a phase locked output; D.C. modulator means, being operatively connected to the feedback path, for D.C. modulating the feedback frequency and the operative connection of the D.C. modulator means to the feedback path comprises synchronizer means for synchronizing the D.C. modulating with the feedback frequency.

In a second aspect of the present invention, an electrical device is provided which comprises phase locking oscillator means, including a loop with a forward path and a feedback path, and including a comparator in the forward path that is operatively coupled to a control input of a first variable frequency oscillator that supplies pulses to the feedback path, for producing a phase locked output; the feedback path extending between an output of the first variable frequency oscillator and an input of the comparator; means, including a second variable frequency oscillator, for changing the frequency of the pulses in the feedback path as a function of the frequency of the second variable frequency oscillator; and synchronizer means, including a synchronizer that is operatively connected to the feedback path and to the second variable frequency oscillator, for synchronizing the changing of the frequency of the pulses in the feedback path.

In a third aspect of the present invention, an electrical device is provided which comprises phase locking oscillator means, including a loop with a forward path and a feedback path, and including a comparator in the forward path that is operatively coupled to a control input of a first variable frequency oscillator, for phase locking the forward and feedback paths to an input frequency; the feedback path extending between an output of the variable frequency oscillator and an input of the comparator; and D.C. modulator means, including a resistor that is interposed into the feedback path, and including a second variable frequency oscillator that is operatively connected to the resistor, for resistively preventing a change in signal level in the feedback path.

In a fourth aspect of the present invention, an electrical device is provided which comprises reference frequency oscillator means for supplying a reference frequency; phase locking oscillator means, being connected to the reference frequency oscillator means, and including a loop with a forward path and a feedback path, and including a comparator in the forward path that is operatively connected to a control input of a variable frequency oscillator, for phase locking the loop to the reference frequency; the feedback path extending between an output of the variable frequency oscillator and an input of the comparator; D.C. modulator means, being operatively connected to the feedback path, for D.C. modulating the frequency in the feedback path; and means, being operatively connected to the feedback path, for channelizing the frequency of the phase locking oscillator means.

In a fifth aspect of the present invention, a method is provided for controlling the output frequency of a loop with a forward path that includes a comparator and a variable frequency oscillator that is operatively connected to the comparator, and with a feedback path that feeds a feedback frequency back from the variable frequency oscillator to an input of the comparator, which method comprises D.C. modulating the feedback path; phase locking the loop to an input frequency substantially simultaneous to the D.C. modulating step; and synchronizing the D.C. modulating step with the feedback frequency.

In a sixth aspect of the present invention, a method is provided for controlling the output frequency of a loop that includes both a forward path and a feedback path, the forward path including a compartor that is connected to a control input of a variable frequency oscillator, and the variable frequency oscillator supplying feedback pulses through the feedback path to an input of the comparator, which method comprises providing an input frequency; phase locking the loop to an input frequency; generating modulation frequencies; changing the pulses in the feedback path as a function of the modulation frequencies; and synchronizing the changing step with the feedback pulses.

In a seventh aspect of the present invention, a method is provided for controlling the output frequency of a loop that includes both a forward path and a feedback path, the forward path including a comparator that is connected to a control input of a variable frequency oscillator, and the variable frequency oscillator supplying a feedback frequency through the feedback path to an input of the comparator, which method comprises providing a modulating frequency; using the modulation frequency to D.C. modulate the frequency in the feedback path; providing an input frequency; phase locking the loop to the input frequency substantially simultaneously with the D.C. modulating step; and the D.C. modulating step comprises resistively preventing a change in signal level in the feedback path as a function of the modulation frequency.

In an eighth aspect of the present invention, a method is provided for controlling the output frequency of a loop that includes both a forward path and a feedback path, the forward path including a comparator that is connected to a control input of a variable frequency oscillator, and the variable frequency oscillator supplying a feedback frequency through the feedback path to an input of the comparator, which method comprises generating modulation frequencies; providing a reference frequency; phase locking the forward and feedback paths to the reference frequency; using the modulation frequencies to D.C. modulate the frequency in the feedback path as a function of the modulation frequencies; and channelizing the output frequency.

In a ninth aspect of the present invention, signal processing apparatus is provided which comprises input stage means for receiving a frequency modulated input signal; an I.F. stage including a local mixer, and including both a local oscillator and an output conductor that are operatively connected to the local mixer; phase locking oscillator means, including a loop with a forward path that includes a comparator and a variable frequency oscillator, and with a feedback path that feeds a feedback frequency from the variable frequency oscillator back to an input of the comparator, for producing a phase locked output; demodulator means, including both the I.F. stage and the phase locking oscillator means, and including both the I.F. stage and the phase locking oscillator means being operatively connected to the input stage means, for producing the D.C. component of the frequency modulated input signal in the output conductor; D.C. modulator means including a modulation oscillator that produces modulation frequencies, and being operatively connected to the output conductor and to the feedback path, for D.C. modulating the phase locked output in response to the D.C. component; and the operative connection of the modulation oscillator to the feedback path comprises synchronizer means, being operatively connected to the modulation oscillator and to the feedback path, for synchronizing the D.C. modulating with the feedback frequency.

In a tenth aspect of the present invention, a method is provided for processing electrical frequencies, which method comprises receiving a frequency modulated input; generating a phase locked output by the steps of providing a reference frequency, using the reference frequency to generate an output frequency in a forward path, using the output frequency to provide a feedback frequency in a feedback path, comparing the feedback frequency with the reference frequency, and using the comparison to phase lock the output frequency; mixing the phase locked output with the frequency modulated input to produce an I.F. input signal; using the I.F. input signal to produce a demodulated output of the frequency modulated input; using the demodulated output to D.C. modulate the feedback frequency; and synchronizing the D.C. modulating step with the feedback frequency.

In an eleventh aspect of the present invention, signal processing apparatus is provided which comprises input stage means for receiving a frequency modulated signal; an I.F. stage including a local mixer, a local oscillator that is operatively connected to the local mixer, and an output conductor that is operatively connected to the local mixer; phase locking oscillator means, including a forward path that includes a comparator and a variable frequency oscillator that is operatively connected to the comparator, and including a feedback path that feeds back a feedback frequency from the variable frequency oscillator to an input of the comparator, for producing a phase locked output; an rf mixer being operatively connected to the input stage means, to the I.F. stage, and to the phase locked output; D.C. modulator means, including a modulation oscillator that is operatively connected to the output conductor and to the feedback path, for D.C. modulating the feedback path as a function of a signal in the output conductor; and the D.C. modulator means comprises synchronizer means for synchronizing the D.C. modulating with the feedback frequency.

DESCRIPTION OF THE PREFERRED EMBODIMENTS

Figure 1:
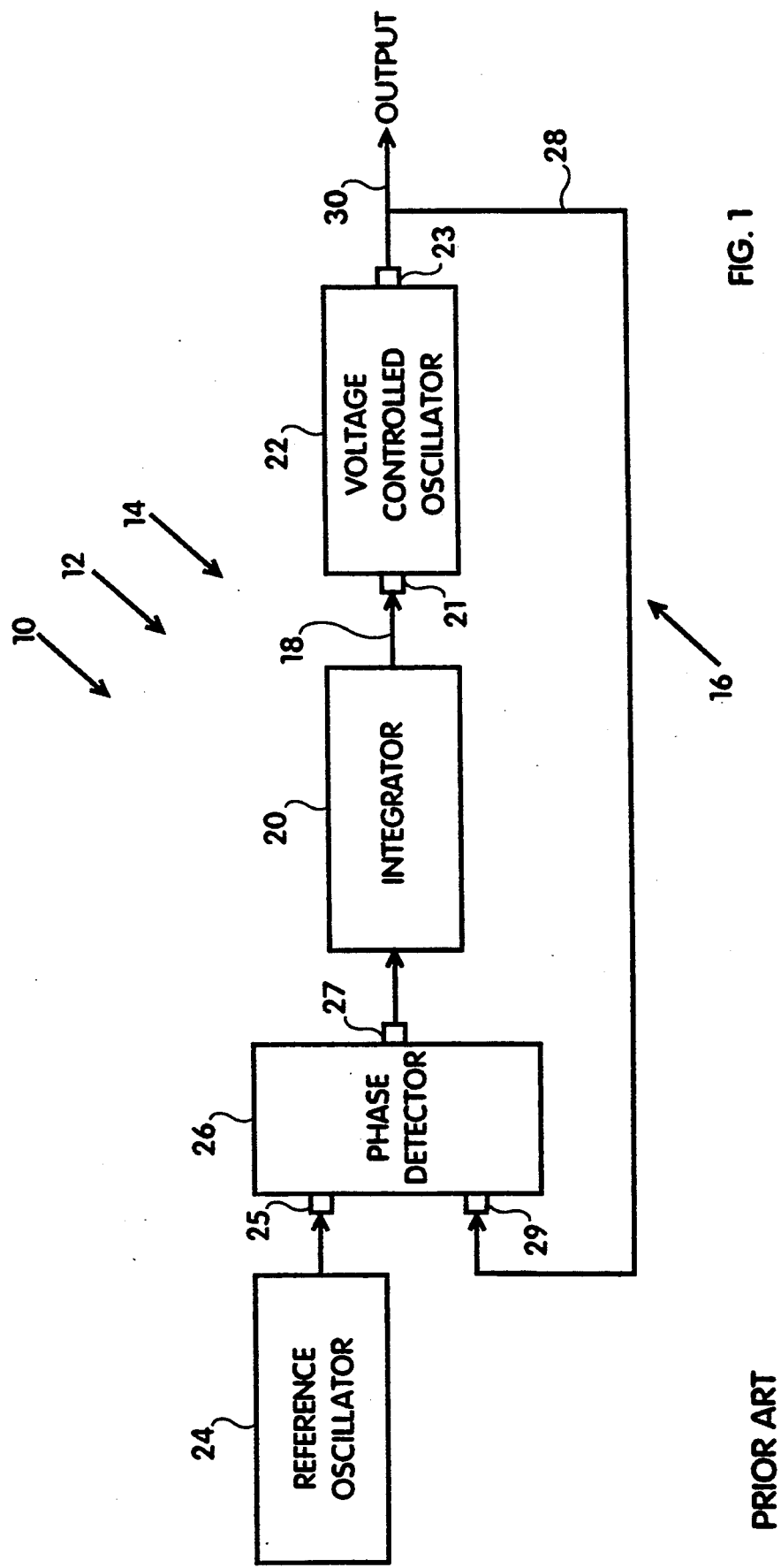
FIG. 1 is a schematic drawing of the most fundamental implementation of a prior art device in which a voltage controlled oscillator is phase locked to a reference oscillator by use of a phase detector and an integrator.

Referring now to FIG. 1, in the most basic configuration of the prior art, a phase locked oscillator 10 includes a phase locked loop 12 with both a forward path 14 and a feedback path 16. The forward path 14 includes a forward path conductor 18, and both an integrator 20 and a variable frequency oscillator, or voltage controlled oscillator, 22 that are interposed into the conductor 18. The voltage controlled oscillator 22 includes both a control input 21 and an output 23; and connections in the forward path 14 included the control input 21 of the voltage controlled oscillator 22 being connected to the integrator 20 by the forward path conductor 18.

Also, the phase locked oscillator 10 includes a crystal controlled reference oscillator, or reference frequency oscillator, 24 and a phase detector, or comparator, 26. An input 25 of the phase detector 26 is connected to the crystal controlled reference oscillator 24, an output 27 of the phase detector 26 is connected to the forward path 14, and an input 29 of the phase detector 26 is connected to the feedback path 16 by a feedback conductor 28.

The output 23 of the variable frequency oscillator 22 is connected to an output conductor 30; and the output conductor 30 is connected to the feedback conductor 28. Thus, the output conductor 30, feeds back the output frequency of the variable frequency oscillator 22 as a feedback signal through the feedback conductor 28 to the input 29 of the phase detector 26. The phase detector 26 performs a time comparison between the leading edge of the phase of the feedback signal and the leading edge of the reference frequency that is supplied by the crystal controlled reference oscillator 24, and supplies this difference to the integrator 20.

The integrator 20 then controls the frequency of the voltage controlled oscillator 22 by supplying voltages thereto that are in accordance with integrated time differences between the leading edges of the phases of the feedback signal and the reference frequency. The effect is that the frequency of the output is phase locked to the frequency of the crystal controlled reference oscillator 24.

Figure 2:
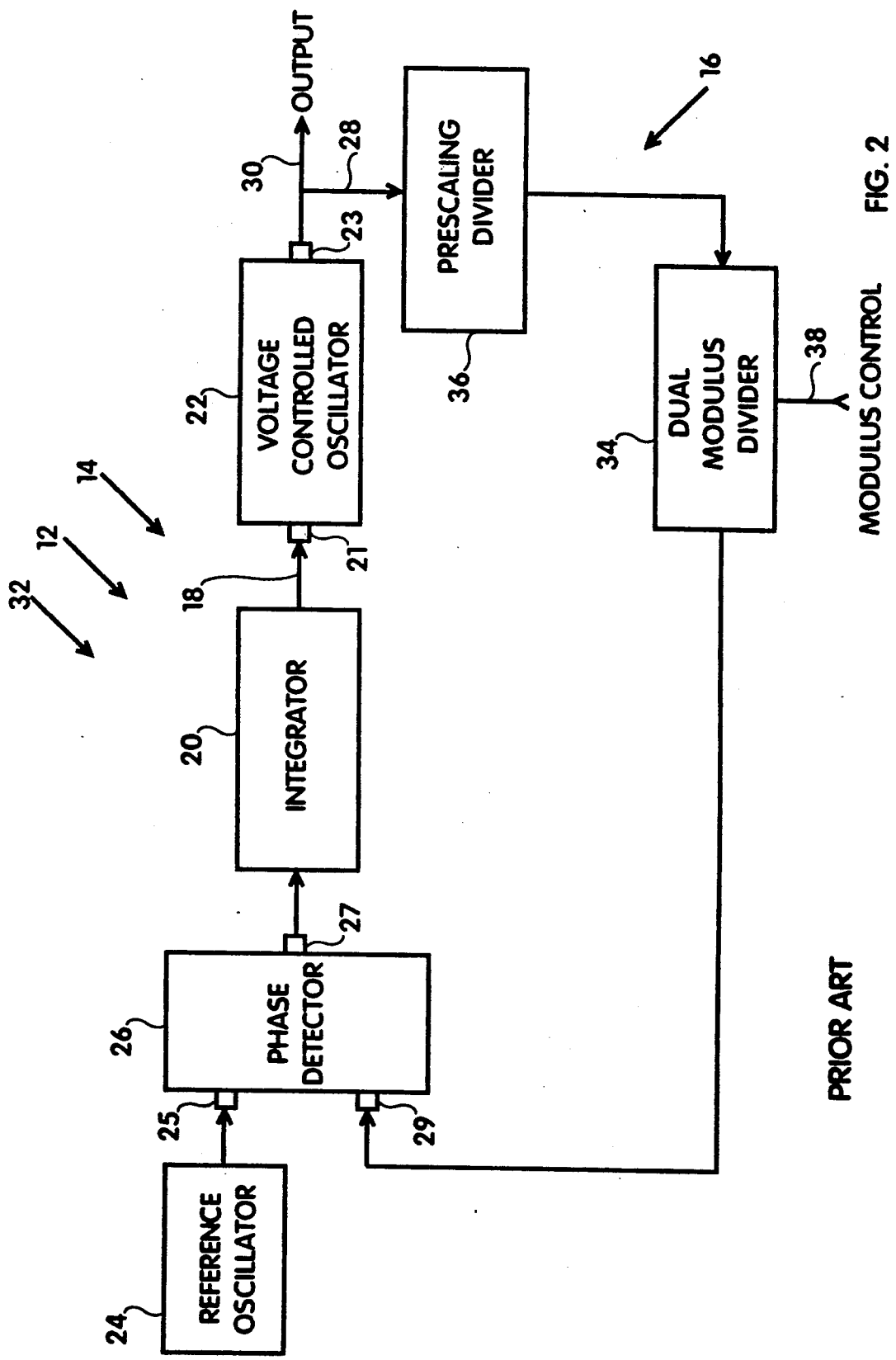
FIG. 2 is a schematic of the prior art device of FIG. 1 with a prescaling divider and a dual modulus divider added thereto.

Referring now to FIG. 2, a phase locked oscillator 32 includes like-named and like-numbered components as recited for FIG. 1, and in addition, the FIG. 2 embodiment includes a dual modulus divider 34 and a prescaling divider 36.

When the prescaling divider 36 is included in the circuitry of FIG. 2, but the dual modulus divider 34 is omitted, the output is divided by some number, perhaps sixteen, so that a feedback signal, having generally the form of a square wave, is produced whose frequency is lower than that of the output. This reduction in the frequency of the feedback signal allows the use of a crystal controlled reference oscillator 24 having a frequency that is less, in this example one-sixteenth, of the output.

In operation, assuming a dividing ratio of sixteen to one, a reduction in frequency of one cycle in the feedback path 16 requires an increase in frequency of sixteen Hertz in the output conductor 30 to phase lock the feedback path 16 to the crystal controlled reference frequency.

When the prescaling divider 36 is omitted from the schematic of FIG. 2, but the dual modulus divider 34 is included, the output frequency is divided, selectively, by two different dividing ratios, such as 40 and 41.

The dividing ratios of the dual modulus divider 34 are controlled by a signal in a modulus control conductor 38 by a modulus controller which will be shown and described in more detail in conjunction with another drawing.

By using the dual modulus divider 34, the frequency of the output can be channelized, and yet the frequency of the output will be closely controlled by the crystal controlled reference frequency, thereby avoiding frequency drift in the output, except for the small drift of the crystal (not shown) in the crystal controlled reference oscillator 24. An example of the use of the dual modulus divider to achieve channelization is included with the discussion of FIG. 3.

Figure 3:
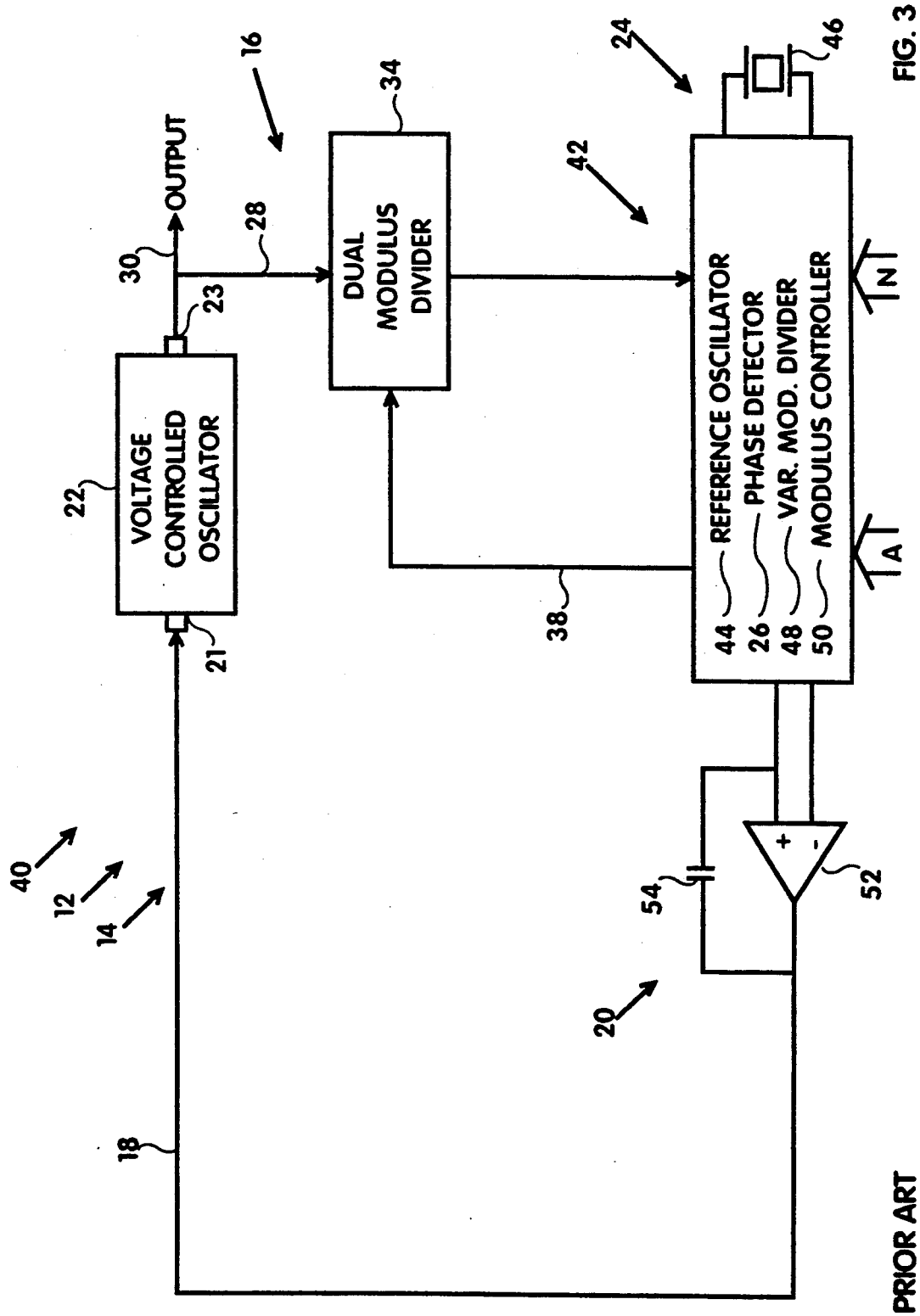
FIG. 3 is a schematic drawing of a prior art device in which an integrated chip provides several of the functions of the prior art embodiment of FIG. 2.
Figure 11:
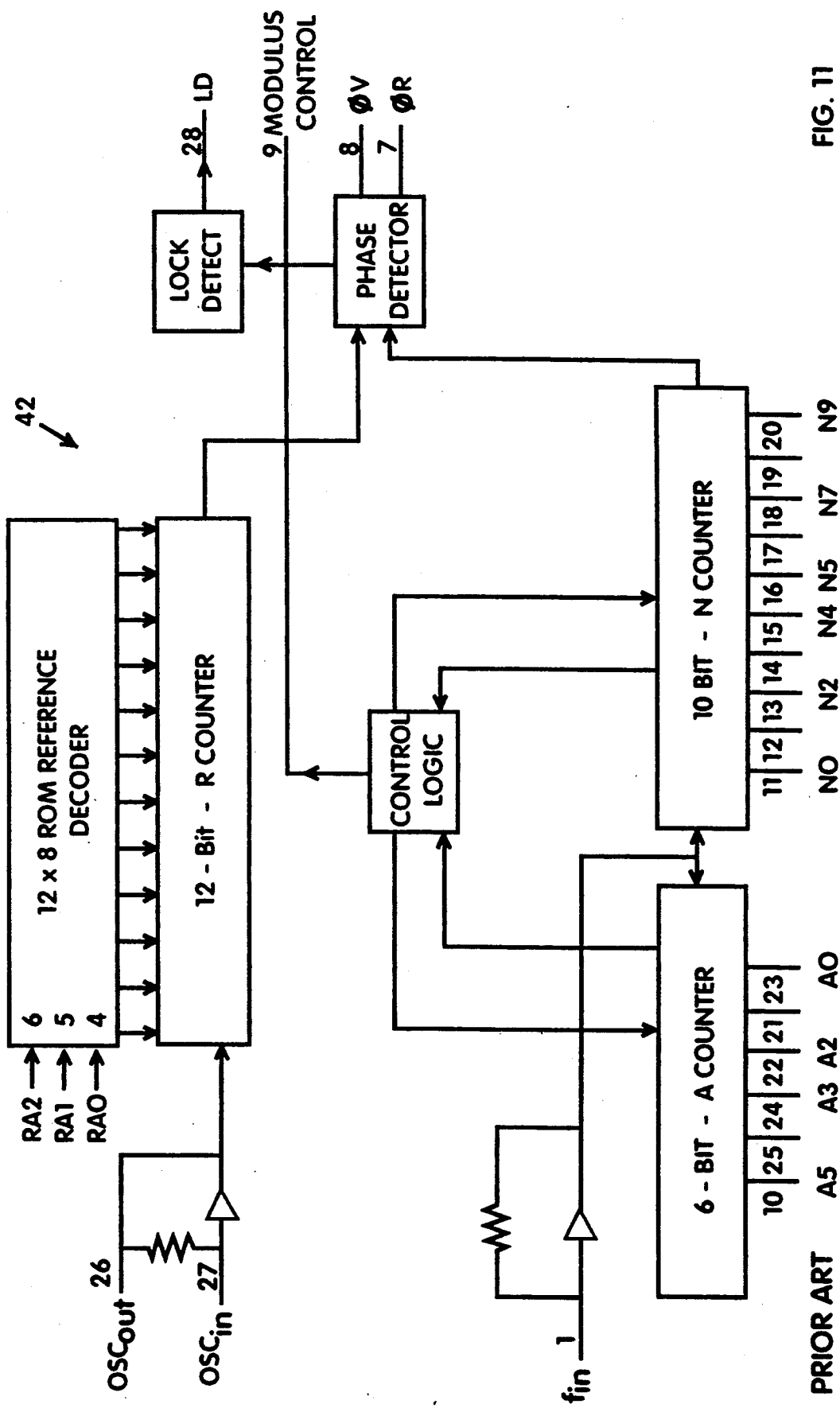
FIG. 11 is a schematic drawing of the integrated chip which is used in the embodiments of FIGS. 3, 6, 7, and 9.

Referring now to FIG. 3, in a phase locked oscillator 40 the prior art embodiment of FIG. 2 is constructed using an integrated chip 42. Preferably, the integrated chip 42 is of the type built by Motorola which is numbered 45152 by the manufacturer, and which is shown in FIG. 11.

The integrated chip 42 includes a reference oscillator 44 that cooperates with a crystal 46 to form the crystal controlled reference oscillator 24 of FIG. 2; and the chip 42 includes the phase detector 26 of FIG. 2.

The integrated chip 42 further includes a variable modulus divider 48 that controls the number of times that the dual modulus divider 34 divides by the lower dividing ratio, and divides by the higher dividing ratio; and the integrated chip 42 includes a modulus controller 50 that controls the change from the lower dividing ratio to the higher dividing ratio to correspond to completion of any given dividing step.

In the FIG. 3 embodiment, the integrator 20 of FIG. 2 consists, in simplified form, of an operational amplifier 52 and a capacitor 54.

While the prescaling divider 36 of FIG. 2 is not included in FIG. 3, it could be included if desired, and the operation of the circuity would be as described for FIG. 2.

Channelization of the output of the voltage controlled oscillator 22 by the dual modulus divider 34 is accomplished as shown in the following example.

To channelize a transmitter starting at 400 MHz with channel steps of 100 KHz: the dual modulus divider 34, with dividing ratios of 40 and 41, divides the 400 MHz output by 40 for 100 times; and a frequency of 100 KHz is fed back to the phase detector 26. With a reference oscillator 44 having a reference frequency of 100 KHz, the frequency of the voltage controlled oscillator 22 will be adjusted until the output frequency in the output conductor 30 is equal to the product of 40 times 100, times the reference frequency of the reference oscillator 24, or 40×100×100 KHz=400 MHz.

To achieve the first channelized frequency above 400 MHz, the N counter of the integrated chip 42 of FIG. 3 is set to 99 so that the dual modulus divider 34 divides by 40 for 99 times; and the A counter is set to divide by 41 once.

When the dual modulus divider 34 divides the 400 MHz by 40 for 99 times, and by 41 for one time, for the loop 12 to phase lock, the phase detector 26 and the integrator 20 must increase the frequency of the voltage controlled oscillator 22 to be equal to [(40×99)+(41×1)]×100 KHz, or 400.1 MHz.

Therefore, reducing the number of times that the dual modulus divider 34 divides by 40, and equally increasing the number of times that the dual modulus divider 34 divides by 41, results in channelization in steps of 100 KHz.

While a reference frequency of 100 KHz has been used in the above examples for ease of computation, in a preferred embodiment a reference frequency of 31,250 Hertz is used.

Figure 4:
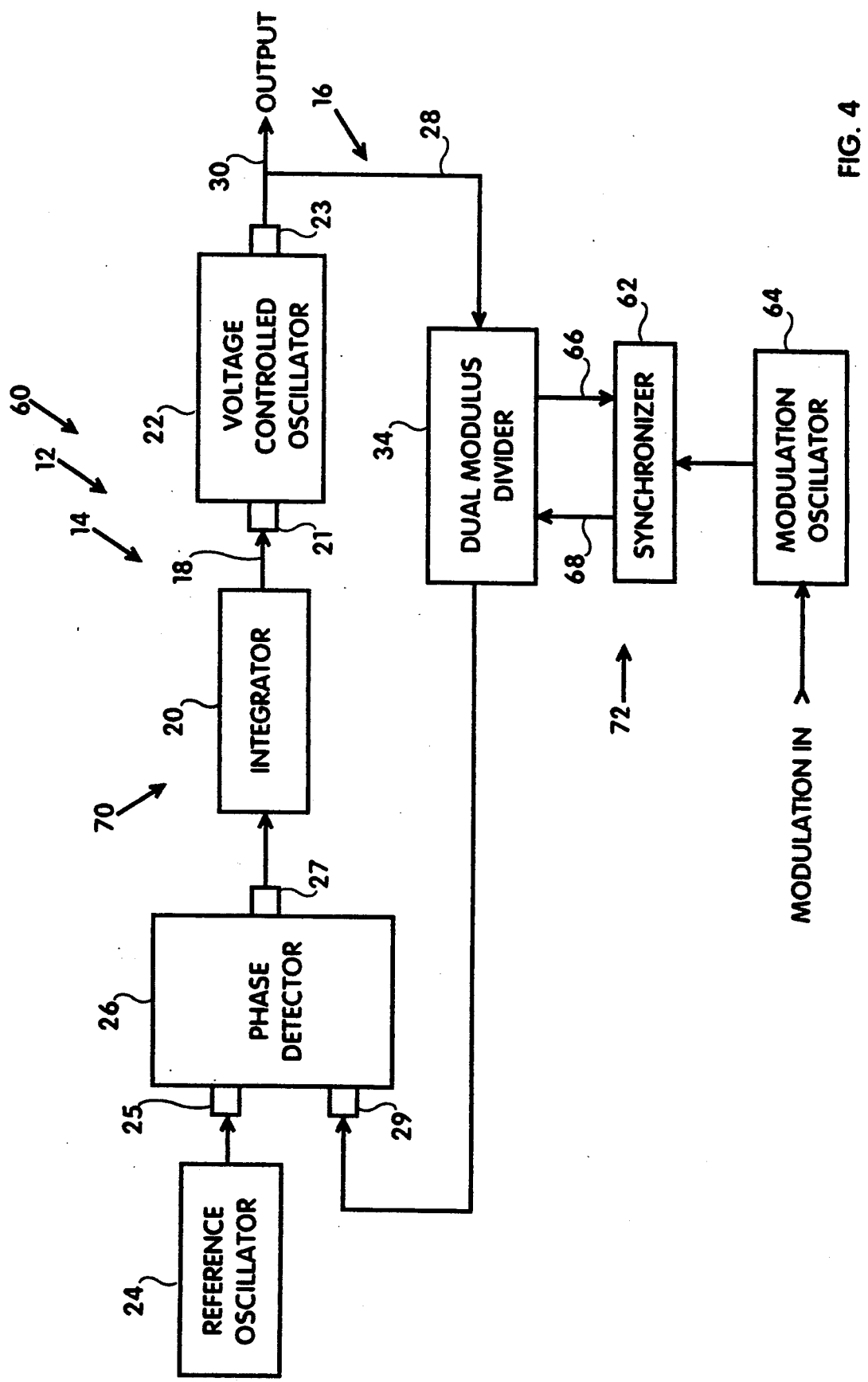
FIG. 4 is a schematic drawing of the present invention in which the feedback path of a voltage controlled oscillator is D.C. modulated by use of a dual modulus divider, a synchronizer, and a voltage controlled audio frequency oscillator.

Referring now to FIG. 4, in a first embodiment of the present invention, an electrical device, or D.C. modulated phase locked oscillator 60, includes like-named and like-numbered components as described in conjunction with FIG. 2, except that the prescaling divider 36 is omitted, and except for additional components that will be described.

In addition to like-named and like-numbered components of FIG. 2, the electrical device 60 of FIG. 4 includes a synchronizer 62 and a variable frequency oscillator, or voltage controlled oscillator, 64 which will be referred to herein as a modulation oscillator, and which preferably is an audio oscillator.

In operation, the modulation oscillator 64 and the synchronizer 62 cooperate to control the dual modulus divider 34, such that for each cycle of the modulation oscillator 64, the dual modulus divider 34 divides by the higher dividing ratio.

If the dual modulus divider 34 has dividing ratios of 40 and 41, and if the modulation oscillator 64 has an output frequency of 100 Hertz, then the dual modulus divider 34 will divide the feedback signal in the feedback conductor 28 by 40, except for 100 times in any given second; and the dual modulus divider 34 will divide the feedback signal by 41 for 100 times each second.

Each time the dual modulus divider 34 divides by the higher dividing ratio, one pulse will be removed from the feedback path 16, and the phase detector 26 will cooperate with the integrator 20 and the voltage controlled oscillator 22 to increase the output frequency by one cycle. Or, as in the example of a modulation oscillator 64 operating at one hundred Hertz, one hundred pulses will be removed from the feedback path 16 each second; and the output frequency in the output conductor 30 will be increased by one hundred Hertz.

Since the modulation oscillator 64 is of the voltage controlled type and is D.C. modulated, and since the phase detector 26 and the integrator 20 cooperate to phase lock the feedback signal to the crystal controlled reference frequency, the output frequency must increase to keep the loop 12 phase locked, and the result is that the output frequency is D.C. modulated.

Since the output frequency is not only D.C. modulated, but also is crystal referenced, the present invention provides means for producing a crystal referenced output that is D.C. frequency modulated.

The D.C. frequency modulated output, being now crystal referenced, has the inherent frequency stability of a crystal; and, since the frequency of the modulation oscillator 64 is quite low, the frequency drift of the modulation oscillator 64, being a function of frequency, is also quite low. Therefore, the combined frequency drift of the crystal controlled reference oscillator 24 and the modulation oscillator 64 is extremely low.

Continuing to refer to FIG. 4, the synchronizer 62 holds a cycle received from the modulation oscillator 64 until it receives a division completion signal from a conductor 66 that connects the dual modulus divider 34 to the synchronizer 62. Then the synchronizer 62 delivers a modulus control signal to a modulus control conductor 68 that changes the dividing ratio of the dual modulus divider 34 from the lower dividing ratio to the higher dividing ratio.

It should be understood that a phase locking oscillator 70 of the FIG. 4 embodiment includes the phase locked loop 12 with both the forward path 14 and the feedback path 16, the voltage controlled oscillator 22 and the integrator 20 in the forward path 14, the crystal controlled reference oscillator 24, and the phase detector 26 that is connected to the reference oscillator 24 and to both the forward path 14 and the feedback path 16.

Further, it should be understood that a D.C. modulator 72 of the FIG. 4 embodiment includes the dual modulus divider 34, the synchronizer 62, and the modulation oscillator 64, all of which are operatively connected to the feedback path 16.

Figure 5:
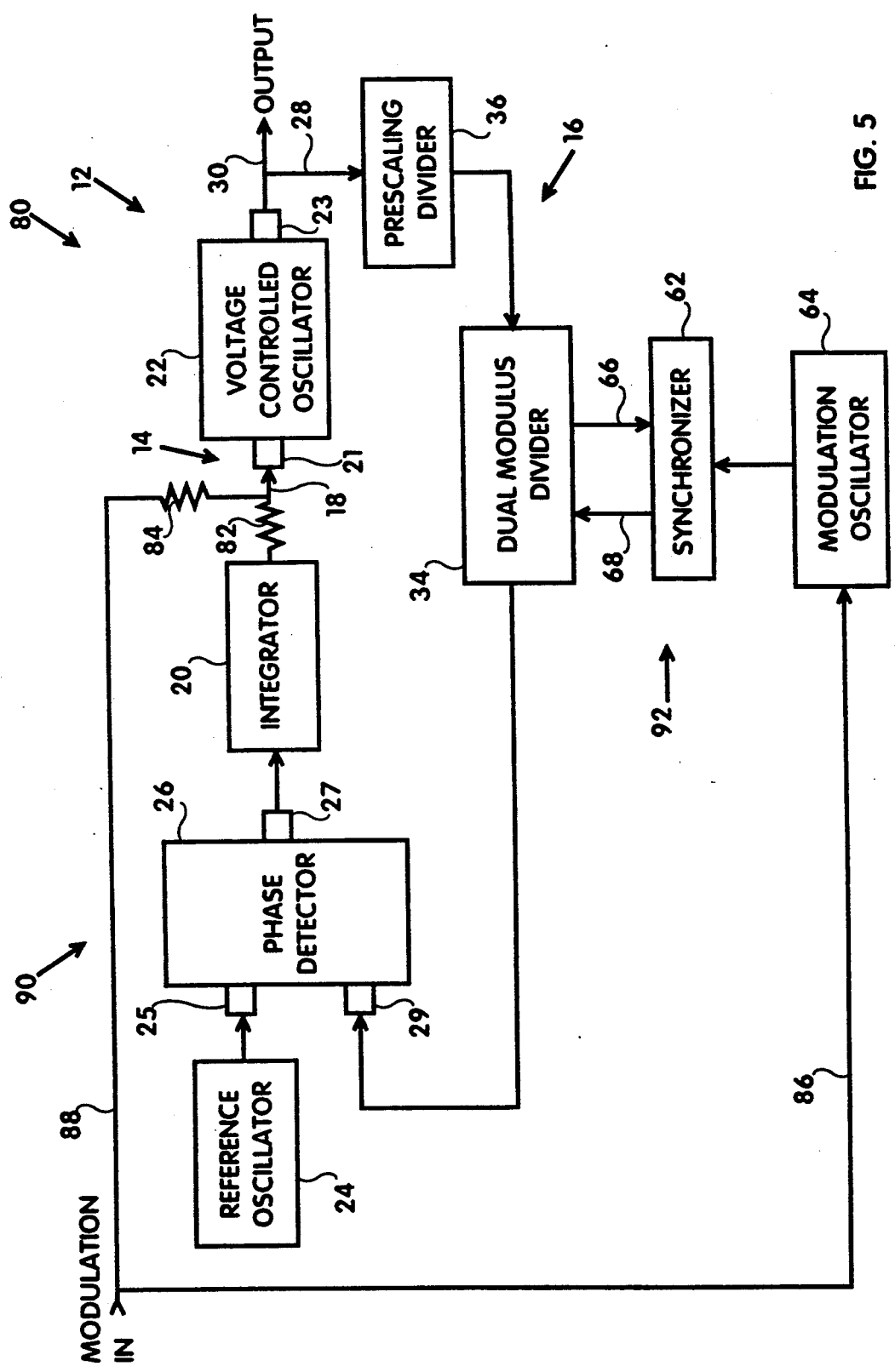
FIG. 5 is a schematic drawing of an embodiment of the present invention in which a prescaling divider and D.C. modulation of the forward path have been added to the FIG. 4 embodiment.

Referring now to FIG. 5, in a second embodiment of the present invention, an electrical device, or D.C. modulated phase locked oscillator, 80 includes like-named and like-numbered components as described in conjunction with FIG. 4. In addition, the embodiment of FIG. 5 includes the prescaling divider 36 of FIG. 2, a summing resistor 82, a summing resistor 84, a modulation conductor 86, and a modulation conductor 88.

The operation of the FIG. 5 embodiment is similar to that described for FIG. 4. The primary difference is that both the forward path 14 and the feedback path 16 are modulated. That is, both the modulation oscillator 64 and the voltage controlled oscillator 22 are D.C. modulated.

The modulation conductor 86 conducts a D.C. modulation signal to the modulation oscillator 64; and the modulation conductor 88 conducts the modulation signal to the summing resistor 84.

The difference in the phase of the frequency of the feedback signal in the feedback path 16 and the phase of the reference frequency of the crystal controlled reference oscillator 24 produces an error signal that is fed to the integrator 20, the integrator 20 feeds an integrated error signal to the summing resistor 82, a modulation signal is fed to the summing resistor 84, and the signals to the summing resistors 82 and 84 are algebraically added to control the frequency of the voltage controlled oscillator 22.

If the feedback path 16 were not modulated so that only the modulation signal of the modulation conductor 88 were connected to the voltage controlled oscillator 22, the phase locking of the loop 12 would cancel the frequency modulation of the output. Therefore, the frequency of the output could be A.C. modulated only, and then only if the modulation frequency were higher than the natural frequency of the loop 12.

If only the feedback path 16 is modulated, as in FIG. 4, D.C. frequency modulation of the output is achieved, but the frequency response is limited by the natural frequency of the loop 12.

Then, to achieve frequency modulation of the output, the phase detector 26 must sense the difference in the frequency between the feedback path 16 and the frequency of the crystal controlled reference oscillator 24, the integrator 20 must integrate the phase differences, the frequency of the voltage controlled oscillator 22 must be changed in accordance with the integrated phase differences, and the phase detector 26 must phase lock the feedback path 16 to the reference frequency of the crystal controlled reference oscillator 24.

However, in the FIG. 5 embodiment, both the forward path 14 and the feedback path 16 are modulated substantially simultaneously, thereby achieving not only D.C. modulation of the output, but also essentially unlimited frequency response.

Referring again to FIG. 5, the inclusion of both the prescaling divider 36 and the dual modulus divider 34 decreases the required frequency of the crystal controlled reference oscillator 24, and decreases the required frequency of the modulation oscillator 64. While reducing the required frequency of the modulation oscillator 64 is advantageous in that the frequency of the modulation oscillator 64 is lowered, and the frequency drift thereof is reduced, the phase locking time is increased as the feedback frequency is decreased.

It should be understood that a phase locking oscillator 90 of the FIG. 5 embodiment includes the phase locked loop 12 with both the forward path 14 and the feedback path 16, the voltage controlled oscillator 22 and the integrator 20 in the forward path 14, the prescaling divider 36 in the feedback path 16, the crystal controlled reference oscillator 24, and the phase detector 26 that is connected to the reference oscillator 24 and to both the forward path 14 and the feedback path 16.

Further, it should be understood that a D.C. modulator 92 of the FIG. 5 embodiment includes the dual modulus divider 34, the synchronizer 62, and the modulation oscillator 64, all of which are operatively connected to the feedback path 16; and the modulator 92 further includes the summing resistors, 82 and 84, and the modulation conductors, 86 and 88.

Figure 6:
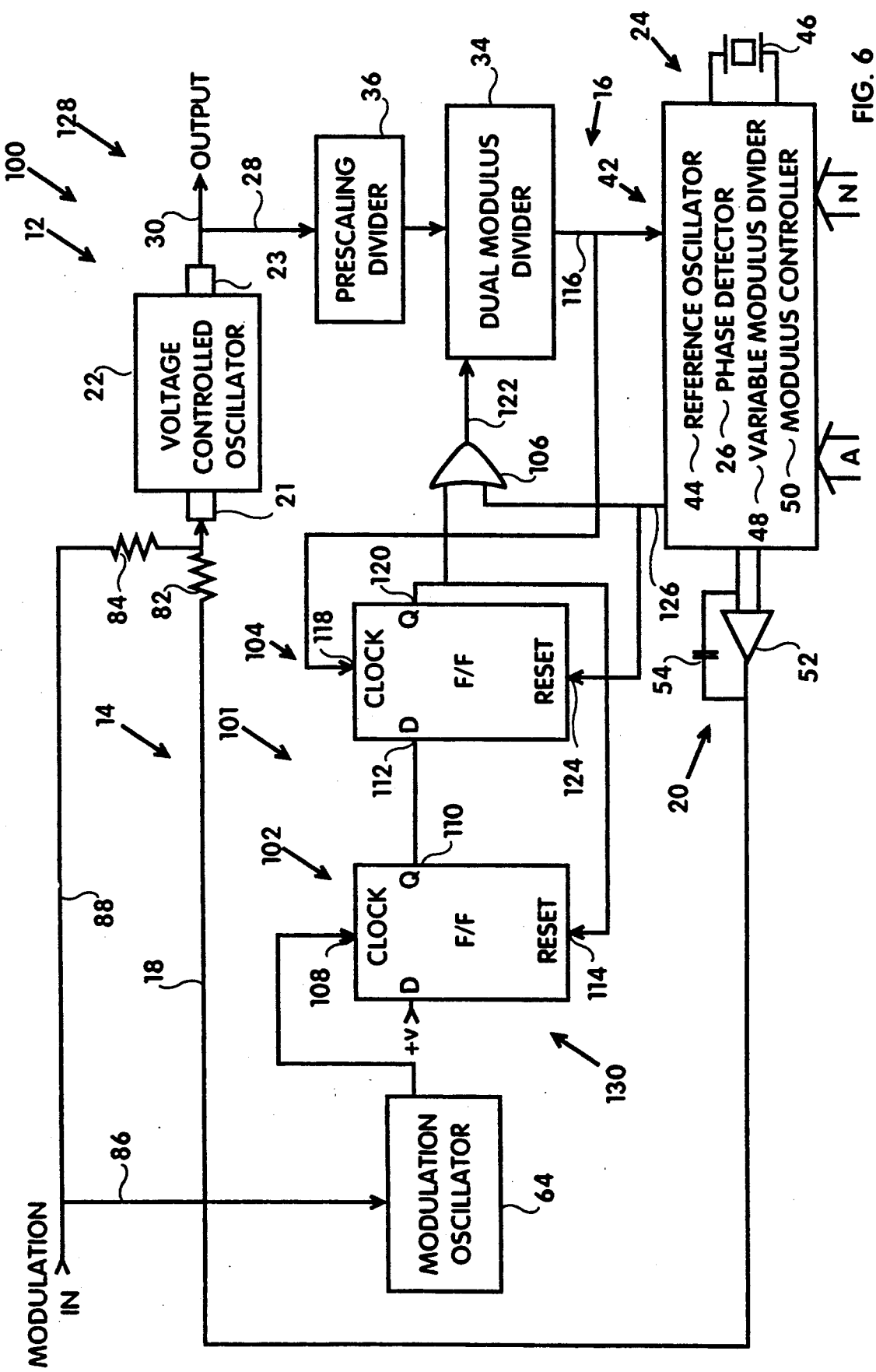
FIG. 6 is a schematic drawing of the present invention in which the synchronizer includes two flip-flops and an OR gate, some of the components of FIGS. 4 and 5 are included in an integrated chip, and the dual modulus divider provides channelization as well as cooperating with the audio frequency oscillator to provide D.C. modulation.

Referring now to FIG. 6, in a third embodiment of the present invention, an electrical device, or D.C. modulated phase locked oscillator, 100 includes like-named and like-numbered components as described in conjunction with FIGS. 1-4.

The electrical device 100 of FIG. 6 produces a crystal referenced output that is D.C. modulated, as has been described for the FIG. 5 embodiment, and the device 100 provides substantially simultaneous modulation of both the forward path 14 and the feedback path 16, also as described for the FIG. 5 embodiment.

In addition, the electrical device 100 of FIG. 6 provides channelization of the output frequency as well as D.C. modulation of the output frequency.

Both D.C. modulation and channelization of the output frequency are achieved by controlling the dual modulus divider 34 by two separate means.

More particularly, channelization is achieved by controlling the dual modulus divider 34 by the variable modulus divider 48 and the modulus controller 50 in the integrated chip 42; and D.C. modulation is achieved by controlling the dual modulus divider 34 by the modulation oscillator 64.

The function of the synchronizer 62 of FIG. 4 is achieved in FIG. 6 by flip-flops, 102 and 104, and by an OR gate 106.

When a cycle, or pulse removing signal, is delivered to a clock terminal 108 of the flip-flop 102 by the modulation oscillator 64, an output terminal, or Q terminal, 110 is energized, thereby energizing an input terminal, or D terminal, 112 of the flip-flop 104. The pulse removing signal from the modulation oscillator 64 is held by the flip-flop 102 until the flip-flop 102 is reset by a signal to a reset terminal 114.

Assuming that the dual modulus divider 34 has been dividing the feedback signal in the feedback path 16 by one or the other of the dividing ratios, when the dual modulus divider 34 has finished performing a dividing operation which is done to achieve channelization, a pulse in a conductor 116 is directed to a clock terminal 118 of the flip-flop 104 and to the modulus controller 50 of the integrated chip 42.

With energizing of the clock terminal 118, a modulus control signal is sent from a Q terminal, or output terminal, 120 of the flip-flop 104 to the dual modulus divider 34 via the OR gate 106 and a conductor 122, thereby changing the dividing ratio of the dual modulus divider 34 from the lower dividing ratio to the higher dividing ratio for one dividing cycle, and thereby removing one pulse from the feedback path 16.

Completion of the next dividing cycle sends a signal in the conductor 116 to the modulus controller 50; and the modulus controller 50 sends a reset signal to a reset terminal 124 of the flip-flop 104 via a conductor 126, and sends a modulus control signal to the dual modulus divider 34 via the conductor 126, the OR gate 106, and the conductor 122.

Also, as a signal is sent from the Q terminal 120 of the flip-flop 104 to the OR gate 106 and to the dual modulus divider 34, a reset signal is sent from the Q terminal 120 of the flip-flop 104 to the reset terminal 114 of the flip-flop 102, thereby resetting the flip-flop 102.

Thus, it can be seen that a synchronizer 62, consisting of the flip-flops, 102 and 104, and the OR gate 106, cooperates with the modulus controller 50 to prevent simultaneous control of the dual modulus divider 34 by the variable modulus divider 48, which provides channelization of the output frequency, and simultaneous control of the dual modulus divider 34 by the modulation oscillator 64 which provides D.C. modulation of the output frequency of the electrical device 100.

It should be understood that, in the FIG. 6 embodiment, the electrical device, or D.C. modulated phase locked oscillator, 100 includes a phase locking oscillator 128 for producing a phase locked output, and a D.C. modulator 130 for D.C. modulating the output frequency of the phase locking oscillator 128.

Also, it should be understood that the phase locking oscillator 128 of the FIG. 6 embodiment includes the phase locked loop 12 with both the forward path 14 and the feedback path 16, the voltage controlled oscillator 22, the operational amplifier 52 and the capacitor 54 which cooperate to provide the integrator 20, the prescaling divider 36, the crystal 46, and the integrated chip 42.

The portions of the integrated chip 42 that are included in the phase locking oscillator 128 are: the reference oscillator 44 which cooperates with the crystal 46 to provide the crystal controlled reference oscillator 24, the phase detector 26, the variable modulus divider 48, and the modulus controller 50.

Finally, it should be understood that the modulator 130 of the FIG. 6 embodiment includes the dual modulus divider 34, the flip-flops, 102 and 104, which cooperate with the OR gate 106 to function as the synchronizer 62 of FIGS. 4 and 5, and the modulation oscillator 64, all of which are operatively connected to the feedback path 16. The modulator 130 of FIG. 6 also includes the summing resistors, 82 and 84, and the modulation conductors, 86 and 88.

As stated above, the dual modulus divider 34 is a part of the modulator 130; but also, the dual modulus divider 34 is a part of the phase locking oscillator 128 as the dual modulus divider 34 cooperates with the variable modulus divider 48 and the modulus controller 50 to provide channelization of the phase locking oscillator 128.

Figure 7:
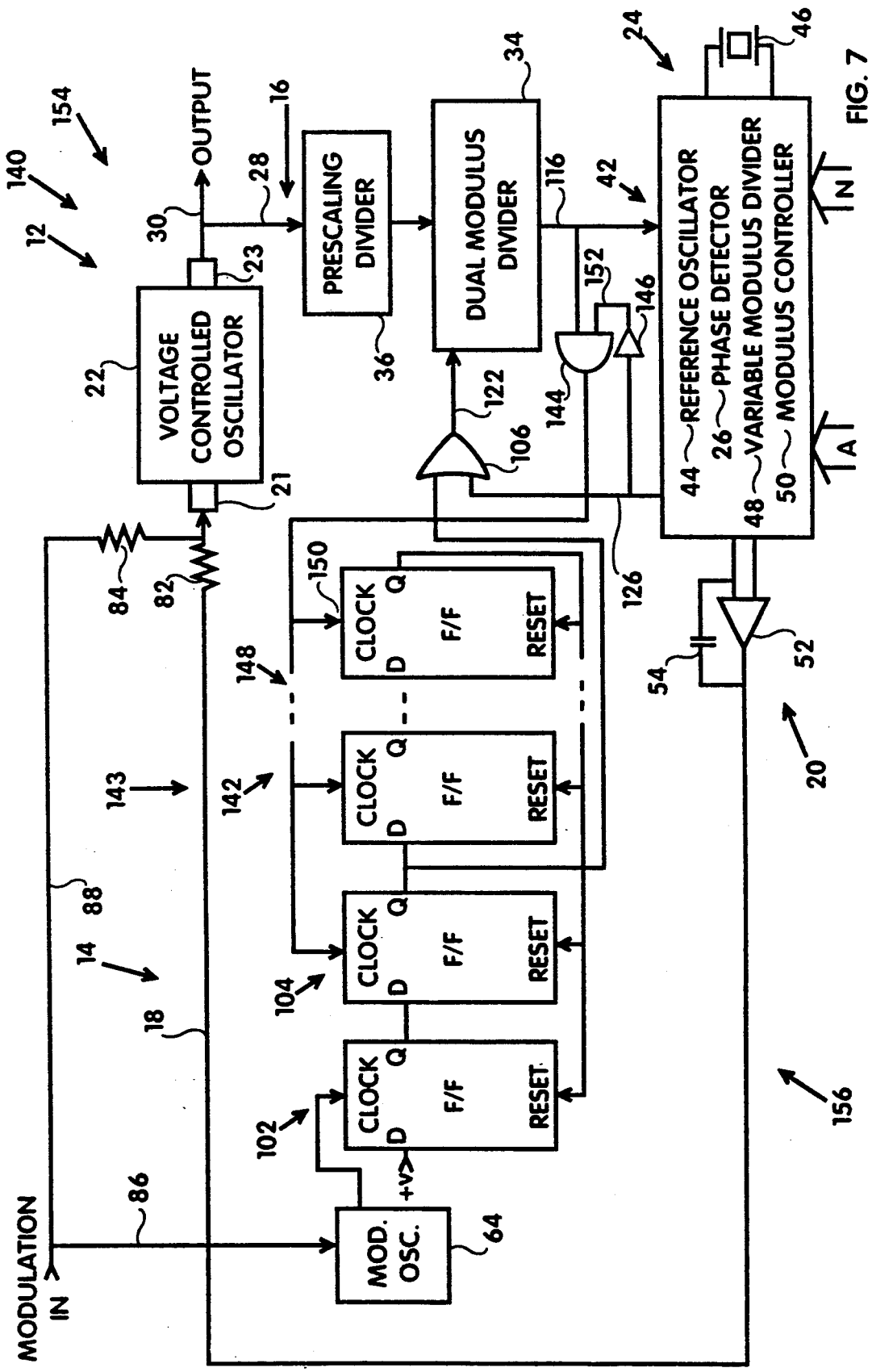
FIG. 7 is a schematic drawing of the present invention in which a shift register is added to the FIG. 6 embodiment to remove a plurality of pulses from the feedback path for each cycle of the modulation oscillator.

Referring now to FIG. 7, in a fourth embodiment of the present invention, an electrical device, or D.C. modulated phase locked oscillator, 140 a shift register 142 is included in addition to the flip-flops, 102 and 104. Further, the synchronizing means of the FIG. 7 embodiment includes the OR gate 106, an AND gate 144, and an inverter 146.

More specifically, the shift register 142 includes the flip-flops, 102 and 104, for achieving the synchronizing functions, and any desired number of flip-flops 148 which cooperate with each other to remove more than one pulse from the feedback path 16 for each cycle of the modulation oscillator 64.

Thus, the shift register 142 provides means for removing a plurality of pulses from the feedback path 16 for each cycle of the modulation oscillator 64. Therefore, the shift register 142 allows the frequency of the modulation oscillator 64 to be relatively low for a given range of frequency modulation of the output, and yet allows the frequency of the crystal controlled reference oscillator 24 to remain relatively high, thereby assuring rapid phase locking together with an adequate range of frequency modulation.

Further, the shift register 142, in allowing the frequency of the modulation amplifier to be quite low, keeps the frequency drift of the modulation oscillator 64 extremely low, so that the combined drift of the modulation oscillator 64 and the crystal controlled reference oscillator 24 are only a fraction of prior art designs.

The operation of the electrical device, or D.C. modulated phase locked oscillator, 140 of FIG. 7 differs from the operation of the FIG. 6 embodiment primarily in the multiple pulse removing of the shift register 142, and in circuitry that is added to inhibit a clock terminal 150 of the shift register 142 when there is conflict between control of the dual modulus divider 34 by the modulus controller 50, and control of the dual modulus divider 34 by the shift register 142.

More particularly, the clock terminal 150 of the shift register 142 is inhibited by the AND gate 144 and the inverter 146 from receiving a signal from the conductor 116, except when a signal provided by the inverter 146 in a conductor 152 is applied to the AND gate 144 simultaneously with a signal in the conductor 116 from the dual modulus divider 34.

It should be understood that, in the FIG. 7 embodiment, the D.C. modulated oscillator 140 includes a phase locking oscillator 154 for producing a phase locked output, and a D.C. modulator 156 for D.C. modulating the output frequency of the phase locking oscillator 154.

Also, it should be understood that the phase locking oscillator 154 of the FIG. 7 embodiment includes the phase locked loop 12 with both the forward path 14 and the feedback path 16, the voltage controlled oscillator 22, the operational amplifier 52 and the capacitor 54 which cooperate to provide the integrator 20, the crystal 46, and the integrated chip 42.

Portions of the integrated chip 42 that are included in the phase locking oscillator 154 are the reference oscillator 44 which cooperates with the crystal 46 to provide the crystal controlled reference oscillator 24, the phase detector 26, the variable modulus divider 48, and the modulus controller 50.

Further, it should be understood that the modulator 156 of the FIG. 7 embodiment includes the dual modulus divider 34, the shift register 142 which cooperates with the OR gate 106, the AND gate 144, and the inverter 146 to function as the synchronizer 62 of FIGS. 4 and 5, and the modulation oscillator 64, all of which are operatively connected to the feedback path 16. The modulator 156 of FIG. 7 also includes the summing resistors, 82 and 84, and the modulation conductors, 86 and 88.

The dual modulus divider 34 functions as a part of the modulator 156 to achieve D.C. modulation of the output frequency, and also functions as a part of the phase locking oscillator 154 to provide channelization of the phase locking oscillator 154.

Figure 8:
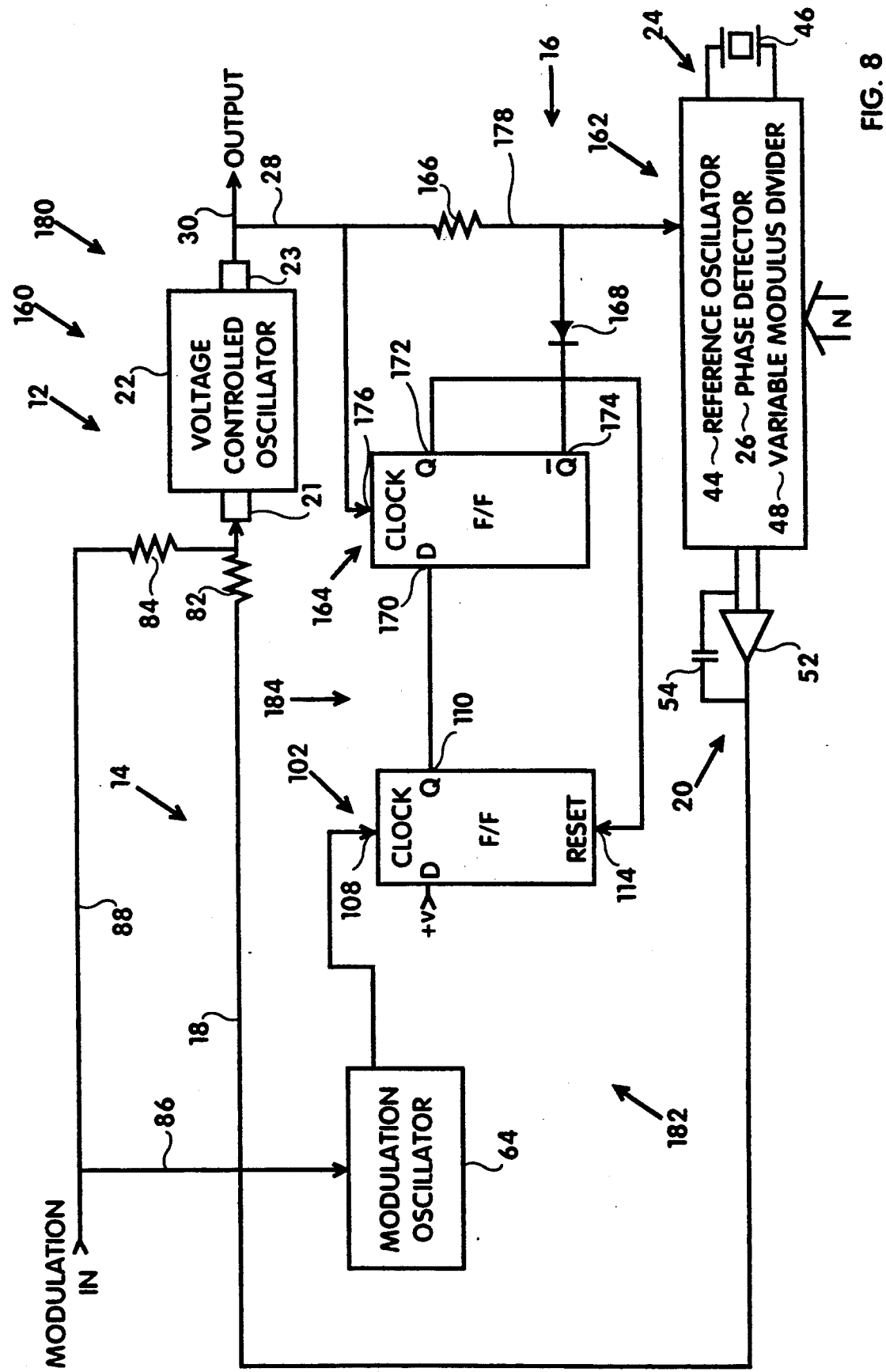
FIG. 8 is a schematic drawing of the present invention in which pulses are removed from the feedback path by a resistor and a diode rather than by a dual modulus divider as in FIGS. 4-7.

Referring now to FIG. 8, an electrical device, or D.C. modulated phase locked oscillator, 160 includes components generally as named, numbered, and described in conjunction with the embodiment of FIG. 6.

However, the electrical device 160 of FIG. 8 does not include the prescaling divider 36, the dual modulus divider 34, the flip-flop 104, the integrated chip 42, or the OR gate 106 of the FIG. 6 embodiment.

Figure 12:
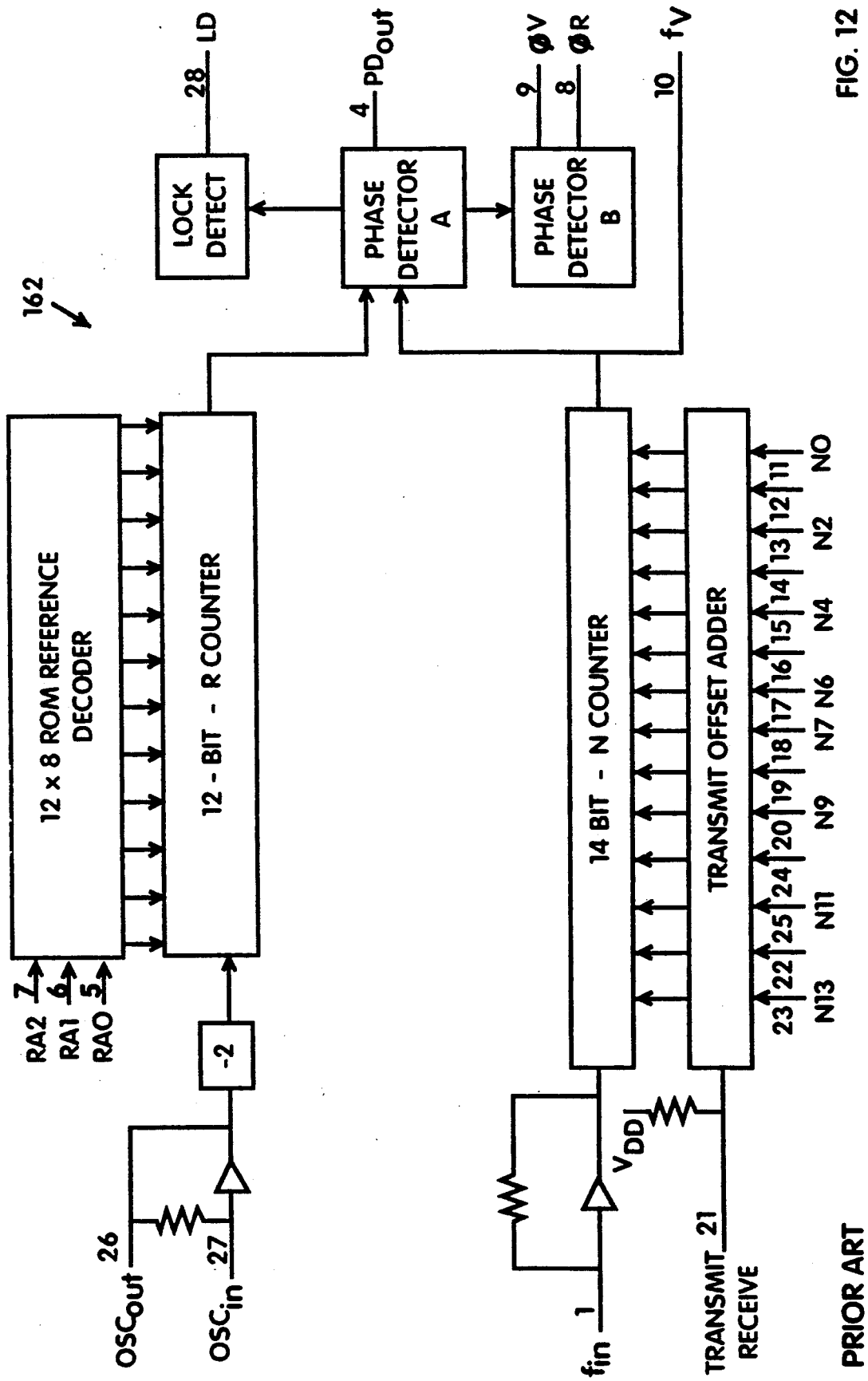
FIG. 12 is a schematic drawing of the integrated chip which is used in the embodiment of FIG. 8.

Instead, the electrical device 160 of FIG. 8 includes an integrated chip 162, a flip-flop 164, a resistor 166, and a diode 168. The integrated chip 162 is of the type manufactured by Motorola under the number 45151 which is shown in FIG. 12. The integrated chip 162 includes the reference oscillator 44, the phase detector 26, and the variable modulus divider 48, all of which function as described for the integrated chip 42. The flip-flop 164 includes a D input terminal 170, a Q output terminal 172, a Not-Q output terminal 174, and a clock terminal 176.

The flip-flops 102 and 164 and the modulus controller 50 cooperate to function as a synchronizer 62 for the embodiment of FIG. 8, as shown by the following description.

In operation, when the flip-flop 164 is in the unclocked state, the Not-Q output terminal 174 is "high", and the diode 168 prevents this "high" from reaching a feedback conductor 178, so that all pulses from the output conductor 30 are fed back to the integrated chip 162.

However, when the modulation oscillator 64 produces a pulse, the flip-flop 102 is clocked, thereby producing a "high" at the output terminal 110 which is delivered to the input terminal 170 of the flip-flop 164. When the next pulse from the output conductor 30 and the feedback conductor 28 is applied to the clock terminal 176 of the flip-flop 164, the flip-flop 164 is clocked to the state wherein the Q output terminal 172 is "high" and the Not-Q output terminal 174 is "low". With the Not-Q output terminal 174 "low", the pulse delivered to the feedback conductor 28 is pulled down by the resistor 166 and the connection of the conductor 178 to the "low" of the Not-Q output terminal 174 via the diode 168.

At substantially the same time, the flip-flop 164, being clocked by the output pulse at the clock terminal 176, delivers a "high" from the output terminal 172 to the reset terminal 114 of the flip-flop 102, thereby resetting the flip-flop 102 for receiving the next pulse from the modulation oscillator 64.

Therefore, for each pulse of the modulation oscillator 64, one pulse is removed from the feedback path 16. That is, one pulse is dissipated, or prevented from reaching, the integrated chip 162; and the phase detector 26 cooperates with the integrator 20 to increase the output frequency of the voltage controlled oscillator 22 to increase the output frequency by one Hertz.

It should be understood that the electrical device 160 includes a phase locking oscillator 180 and a D.C. modulator 182. The phase locking oscillator 180 includes the voltage controlled oscillator 22, the crystal controlled reference oscillator 24, the phase detector 26, and the variable modulus divider 48. The D.C. modulator 182 includes the modulation oscillator 64, the flip-flops 102 and 164, the resistor 166, the diode 168, and the resistors 82 and 84.

Figure 9:
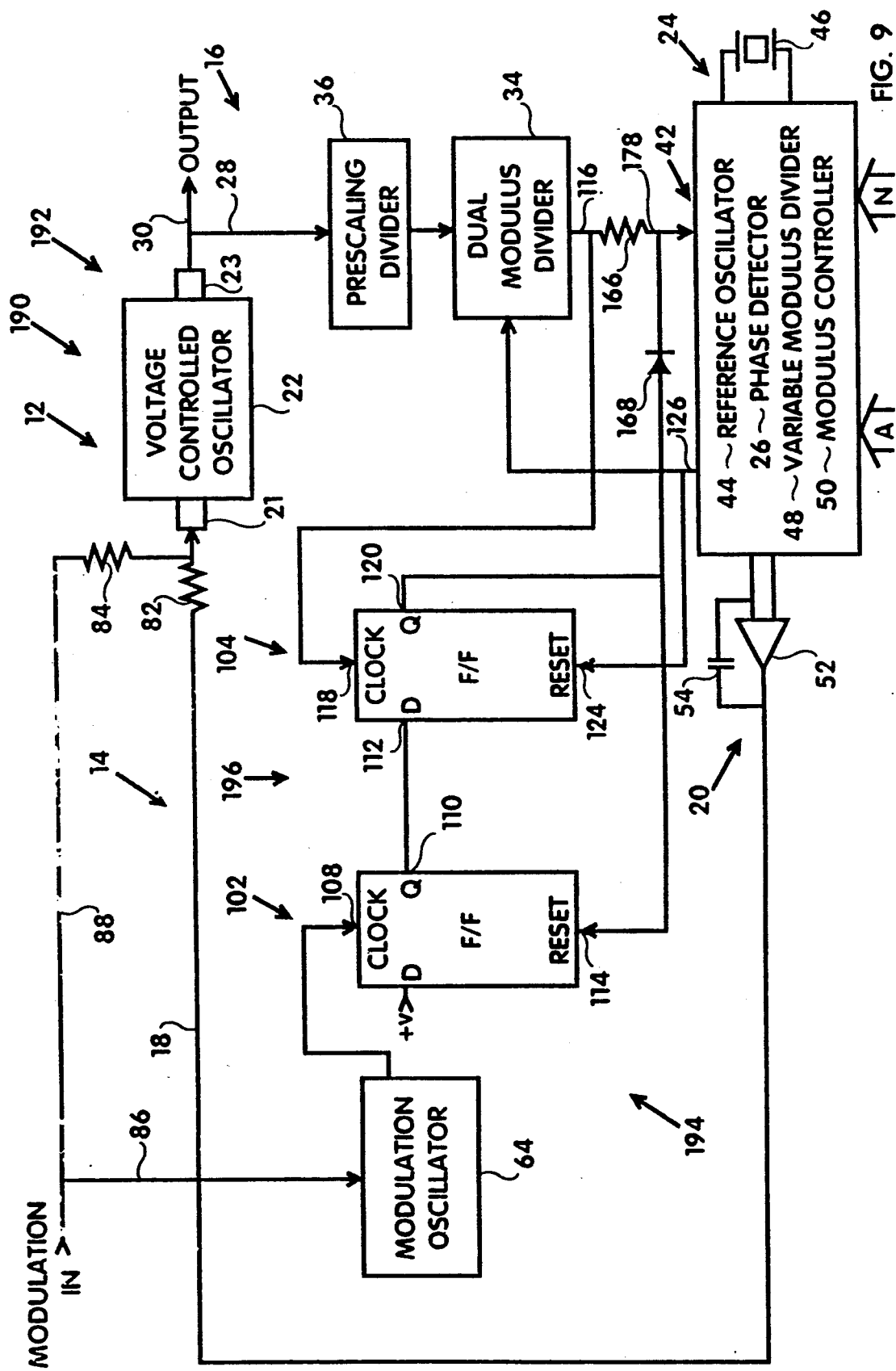
FIG. 9 is a schematic drawing of the present invention in which a resistor and a diode are used in conjunction with a dual modulus divider to achieve extremely wide frequency modulation of a phase locked output.

Referring now to FIG. 9, an electrical device, or D.C. modulated phase locked oscillator, 190 includes components generally as named, numbered, and described in conjunction with the embodiment of FIG. 6.

However, the electrical device 190 of FIG. 9 does not include the OR gate 106 of the FIG. 6 embodiment. Instead, the electrical device 190 of FIG. 9 includes the resistor 166 and the diode 168 of FIG. 8.

The flip-flops 102 and 104 and the modulus controller 50 cooperate to function as a synchronizer 62 for the embodiment of FIG. 9, as shown by the following description.

In operation, when the flip-flop 104 is in the unclocked state, the diode 168 blocks current flow to the output terminal 120; and the circuitry functions as described for FIG. 6.

However, when the modulation oscillator 64 produces a pulse, the flip-flop 102 is clocked, producing a "high" at the output terminal 110 and energizing the input terminal 112 of the flip-flop 104. Then, when the dual modulus divider 34 finishes a division by one of the dual dividing ratios, it delivers a pulse to the conductor 116, clocking the flip-flop 104.

With the flip-flop 104 clocked, a "high" is produced at the output terminal 120 of the flip-flop 104; and this high at the output terminal 120 is used to reset flip-flop 102 in preparation for another pulse from the modulation oscillator 64.

In addition, this high from the output terminal 120 is delivered to the conductor 178, making the conductor 178 "high". With the output terminal 120 connected to the conductor 178 through the diode 168, and with the resistor 166 being interposed between the conductors 178 and 116, the conductor 178 is kept "high" as the conductor 116 goes "low" between pulses.

The result is, by preventing a "low" in the conductor 178 between two pulses delivered to the conductor 116 by the dual modulus divider 34, two pulses are combined into one; and in effect, one pulse is removed from the feedback path 16 in the conductor 178.

Removing one pulse from the conductor 178 effectively removes a number of pulses from the feedback path 16 that is equal to the dividing ratio of the prescaling divider 36 times the lower dividing ratio of the dual modulus divider 34.

For instance, if the prescaling divider 36 has a dividing ratio of 16, and if the lower dividing ratio of the dual modulus divider 34 is 20, then each pulse of the modulation oscillator 64 removes 16 times 20, or 320 pulses from the feedback path 16. Therefore, to increase the output of the voltage controlled oscillator 22 by 10 MHz, the required frequency of the modulation oscillator 64 would be 31,250 Hertz.

Notice that in this manner extremely wide frequency deviations can be achieved. This is, of course, at the expense of increased drift since the modulation oscillator drift is multiplied by the ratio shown above, that is, 320. In the example shown, a typical drift of 30 kHz at the output could be caused by the drift of the modulation oscillator 64 when multiplied by 320. This drift is still well within the drift allowed from transmitters which would use this wider deviation capability.

The electrical device 190 of FIG. 9 provides a much greater frequency deviation for a given frequency of the modulation oscillator 64 than does the electrical device 140 of FIG. 7, since a counter or a shift register, such as the shift register 142, removes only a small number of plurality of pulses from the feedback path 16 for each pulse of the modulation oscillator 64. More specifically, if the shift register 142 removes 10 pulses from the feedback path 16 for each cycle of the modulation oscillator 64, the electrical device 190, in removing 320 pulses from the feedback path 16 for each cycle of the modulation oscillator 64, removes 32 times as many pulses from the feedback path 16 for each cycle of the modulation oscillator 64.

Further, as previously noted, since the frequency drift of a voltage controlled oscillator, such as the modulation oscillator 64, is smaller, as a percentage of output frequency, for lower frequencies, the total drift of the D.C. modulated oscillator 190 as described herein is less when a plurality of pulses are removed from the feedback path 16 for each cycle of the modulation oscillator 64, and the frequency of the modulation oscillator 64 is reduced.

The pulse removal, or pulse combining, as described in conjunction with FIG. 9, must be prohibited when the dual modulus divider 34 is in the higher mode to prevent an incorrect output frequency. To prevent the pulse removing function from removing a pulse resulting from division at the higher dividing ratio, the conductor 126 is connected to the flip-flop 104 in addition to being connected to the dual modulus divider 34. This connection of the conductor 126 to the flip-flop 104 provides synchronization of the modulating and dividing functions as described previously.

It should be understood that the electrical device 190 of FIG. 9 includes a phase locking oscillator 192 and a D.C. modulator 194. The phase locking oscillator 192 includes the voltage controlled oscillator 22, the crystal controlled reference oscillator 24, the phase detector 26, the variable modulus divider 48, and the modulus controller 50. The D.C. modulator 194 includes the modulation oscillator 64, the flip-flops 102 and 104, the resistor 166, the diode 168, and the resistors 82 and 84.

Referring again to FIG. 6, if the dual modulus divider 34 were set so that the normal state were to divide at the higher dividing ratio, rather than normally to divide at the lower dividing ratio, then, in effect, one pulse would be added to the feedback path 16, rather than removed therefrom.

That is, if the dual modulus divider 34 were dividing by a dividing ratio of 21, and then dividing at the ratio of 20 once per second, the frequency in the feedback path 16, as supplied to the phase detector 26, would be increased by one pulse per second; and the phase detector 26 and the integrator 20 would cooperate with the voltage controlled oscillator 22 to reduce the output frequency by one Hertz.

Of course, to obtain an increase in the output frequency as a function of the frequency of the modulation oscillator 64, with the dividing ratios inverted as noted above, would require providing an inverted D.C. modulation voltage to the modulation oscillator 64, while continuing to supply an uninverted D.C. modulation voltage to the resistor 84.

It is important to notice that D.C. modulation of a phase locked loop is achieved in the present invention by either removing pulses from the feedback path 16 or adding pulses to the feedback path 16.

Removal of pulses is achieved by increasing the dividing ratio of the dual modulus divider 34 once for each cycle of the modulation oscillator 64 as shown in FIG. 6, by increasing the dividing ratio a plurality of times for each cycle of the modulation oscillator 64 as shown in FIG. 7, by removing a very large number of pulses from the feedback path 16 when both the prescaling divider 36 is included and one output pulse is eliminated, as shown in FIG. 9, or by removing many pulses from the feedback path 16 by eliminating one output pulse from a circuit in which either the dual modulus divider 34 or the prescaling divider 36 is included.

Removal of pulses, or elimination of pulses, is achieved by preventing a "high" from passing though the resistor 166 of FIG. 8, thereby removing a pulse by dissipating it through the resistor 166 to a "low" of the Not-Q output terminal 174.

Also, removal of pulses is achieved by preventing a "low" from appearing in the conductor 178 of FIG. 9 by placing a "high" in the conductor 178 from the output terminal 120, through the diode 168, and into the conductor 178, while isolating the "high" in the conductor 178 from a "low" in the conductor 116 by the resistor 166 for one cycle.

Or, stated more broadly, the use of the resistor 166 and the diode 168 prevents a change in the signal level in the feedback path 16.

In FIGS. 4 and 5, the synchronizer 62 is shown symbolically. In the FIG. 6 embodiment, the synchronizer 62 includes the flip-flops 102 and 104, the OR gate 106, and the modulus controller 50 of the integrated chip 42. In the FIG. 7 embodiment, the synchronizer 62 includes the flip-flops 102 and 104, the OR gate 106, the AND gate 144, the inverter 146, and the modulus controller 50. In the FIG. 8 embodiment, the synchronizer 62 includes the flip-flops 102 and 164. And, in the FIG. 9 embodiment, the synchronizer 62 includes the flip-flops 102 and 104, and the modulus controller 50.

Figure 10:
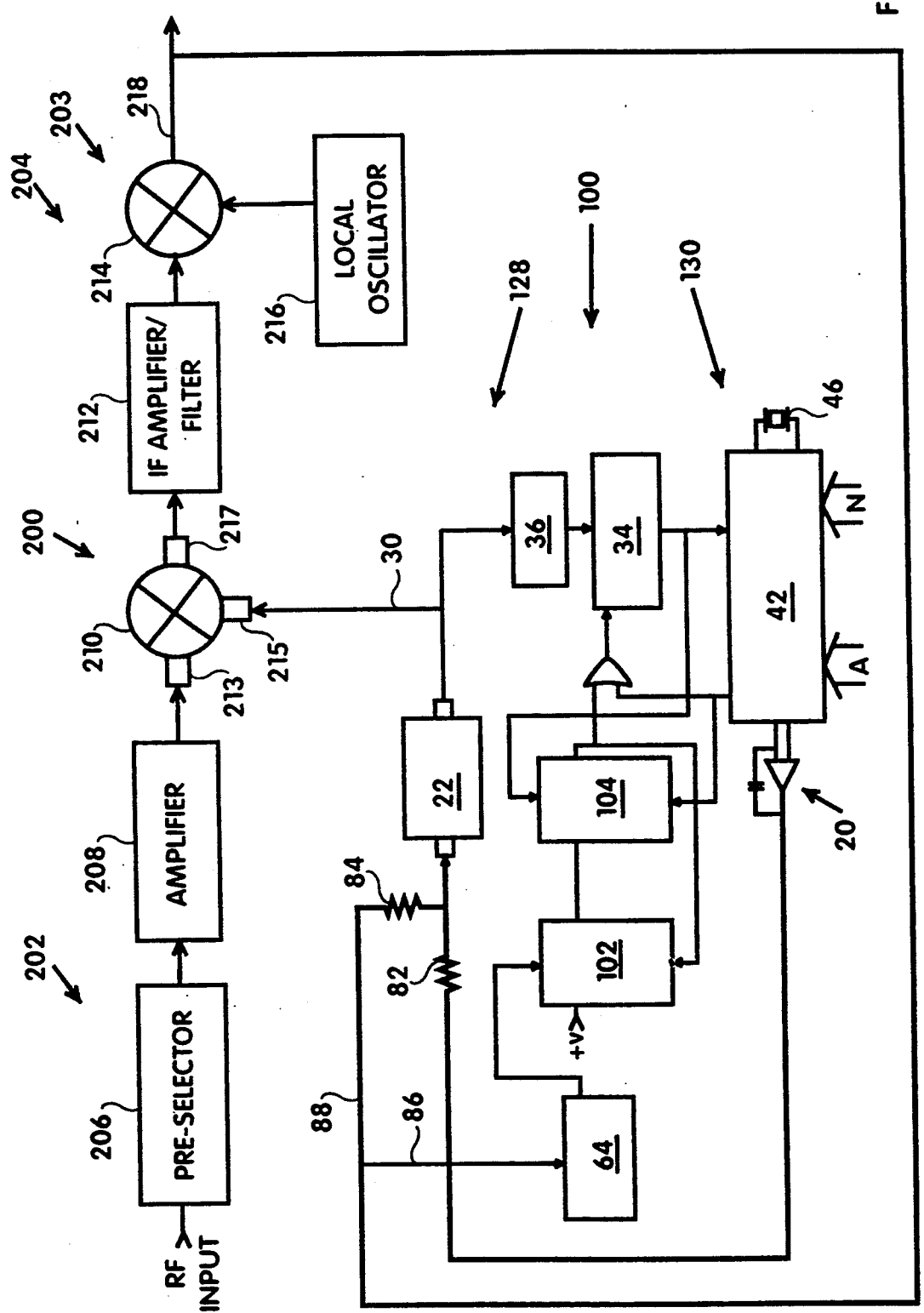
FIG. 10 is a channelized radio frequency receiver of the present invention in which the D.C. modulated oscillator of FIG. 7 is used together with an input stage and a demodulator stage.

Referring now to FIG. 10, a radio frequency receiver, or signal processing apparatus, 200 comprises an input stage 202 an I.F. stage 203, a demodulator 204 that includes both the I.F. stage 203, an rf mixer 210, and the phase locking oscillator 128 of FIG. 6, and the modulator 130 of FIG. 6.

The input stage 202 includes an rf preselector 206 and an rf amplifier 208; and the I.F. stage 203 includes an I.F. amplifier/filter 212, a local mixer 214, and a local oscillator 216.

More particularly, the input stage 202 is connected to a first input 213 of the rf mixer 210, the phase locking oscillator 128 is connected to a second input 215 of the rf mixer 210, and the I.F. amplifier/filter 212 of the I.F. stage 203 is connected to an output 217 of the rf mixer 210.

In operation, the input stage 202 receives and amplifies an rf input signal that is frequency modulated; the phase locking oscillator 128 generates a phase locked signal, that is, a signal that is phase locked to a crystal controlled reference frequency; the amplified rf signal is mixed with the phase locked signal in the rf mixer 210 and demodulated in the I.F. stage 203 to produce a demodulated output signal in an output conductor 218; and the modulator 130 uses the demodulated output signal to D.C. modulate the phase locked signal, thereby modulating the output signal of the conductor 218.

The rf input signal may be in the 2200 to 2400 MHz range and the local oscillator 216 may have a frequency of 500 MHz. However, these frequencies are given merely as an example. In actual practice, the input frequencies may be in any range of rf frequencies, or even in frequencies that are below the rf range, and that are connected to the receiver 200 by other means, such as electrical connection or light waves.

For purposes of understanding the claims, it should be recognized that the signal processing apparatus 200 of FIG. 10 includes the electrical device 100 of FIG. 6.

More particularly, it should be recognized that the circuitry of the radio frequency receiver 200 includes the phase locking oscillator 128 and the D.C. modulator 130, both of FIG. 6.

Referring again to FIG. 4, for purposes of understanding the claims, the following should be observed:

The output 27 of the phase detector 26 controls the integrator 20, the integrator 20 controls the VCO 22, and the VCO 22 produces the output frequency in the output conductor 30. Because of this forward progression of control, as opposed to feedback of the output signal from the output conductor 30 to the input 29 of the phase detector 26, as used in the appended claims, the forward path 14 of the phase locked loop 12 includes: the phase detector 26, the integrator 20, the forward path conductor 18, the VCO 22, and the output conductor 30.

In like manner, since the output signal feeds back from the output conductor 30 to the input 29 of the phase detector 26 as a feedback signal, as used in the appended claims, the feedback path 16 includes the feedback conductor 28 and the dual modulus divider 34.

Since the phase detector 26 provides an output which is a function of the difference between the phase angles of the feedback signal to the input 29 and the reference frequency in the input 25, the phase detector 26 is a part of the forward path 14.

It follows that the electrical components of the other embodiments of the present invention can be understood to be a part of the forward path 14, to be a part of the feedback path 16, or to be a part of neither one, in accordance with the flow of signal from the phase detector 26 toward the output conductor 30, or the flow of signal from the output conductor 30 back to the phase detector 26.

For instance, it is evident that the prescaling divider 36 of FIG. 5 is in the feedback path 16. In like manner, referring to FIG. 6, the output conductor 30, the prescaling divider 36, the dual modulus divider 34, and the A and N counters of the variable modulus divider 48 of the integrated chip 42 are a part of the feedback path 16. However, it is obvious that the reference oscillator 44 of the integrated chip 42 is not a part of the forward path 14, nor a part of the feedback path 16; because it is outside the loop 12.

Further, it should be recognized that each of the electrical devices 60, 80, 140, 160, and 190 of FIGS. 4, 5, 7, 8, and 9 includes a phase locking oscillator 70, 90, 154, 180, or 192, respectively, for producing a phase locked output; and each of the electrical devices 60, 80, 140, 160, and 190 of FIGS. 4, 5, 7, 8, and 9 includes a modulator 72, 92, 156, 182, or 194, respectively, for D.C. modulating the output of the phase locking oscillator 70, 90, 154, 180, or 192, respectively.

Therefore, any of the oscillators and modulators of FIGS. 4, 5, 7, 8, or 9, or any other components that provide the same functions, can be substituted for the phase locking oscillator 128 and the D.C. modulator 130 which are shown in FIG. 10.

While the present invention has been described with particular components, it should be understood that the scope of the present invention is to be determined by the terminology used in the claims, and by the functions recited therein, without regard to more specifically described components in the detailed description.

Further, while examples have been given for frequencies, it should be understood that the present invention will function as described, and is useful in the gigahertz range, in the megahertz range, in the kilohertz range, and below the kilohertz range. For this reason, frequency limiting terms, such as radio frequency, are not needed, nor included, in the claims.

While specific apparatus and method have been disclosed in the preceding description, and while part numbers have been inserted parenthetically into the claims to facilitate understanding of the claims, it should be understood that these specifics have been given for the purpose of disclosing the principles of the present invention and that many variations thereof will become apparent to those who are versed in the art. Therefore, the scope of the present invention is to be determined by the appended claims, and without any limitation by the part numbers inserted parenthetically in the claims.

INDUSTRIAL APPLICABILITY

The present invention is applicable to phase locked oscillators, voltage controlled crystal oscillators, single frequency transmitters and receivers, channelized transmitters and receivers, telemetry and video transmitters such as are used for commercial, consumer, and military products, and to all such electrical devices in which low frequency drift, inclusion of a maximum number of channels within a limited frequency range, large frequency deviations, and/or rapid synchronization to modulation frequencies are/is required, whether the output frequencies be in the gigahertz range, in the megahertz range, in the kilohertz range, or even lower than the kilohertz range.

What is claimed is:

1. An electrical device (60, 80, 100, 140, 160, or 190) which comprises:
    phase locking oscillator means (70, 90, 128, 154, 180, or 192), comprising a loop (12) with a forward path (14) that includes a comparator (26) and a variable frequency oscillator (22) that is operatively connected to said comparator, and with a feedback path (16) that feeds a feedback frequency from said variable frequency oscillator back to an input (29) of said comparator, for producing a phase locked output;
    D.C. modulator means (72, 92, 130, 156, 182, or 194), being operatively connected to said feedback path, for D.C. modulating said feedback frequency; and
    said operative connection of said D.C. modulator means to said feedback path comprises synchronizer means (62) for synchronizing said D.C. modulating with said feedback frequency.

2. An electrical device (60, 80, 100, 140, 160, or 190) which comprises:
    phase locking oscillator means (70, 90, 128, 154, 180, or 192), comprising a loop (12) with a forward path (14) and a feedback path (16), and comprising a comparator (26) in said forward path that is operatively coupled to a control input (21) of a first variable frequency oscillator (22) that supplies pulses to said feedback path, for producing a phase locked output;
    said feedback path extending between an output (23) of said first variable frequency oscillator and an input (29) of said comparator;
    means, comprising a second variable frequency oscillator (64), for changing the frequency of said pulses in said feedback path as a function of the frequency of said second variable frequency oscillator; and
    synchronizer means, comprising a synchronizer (62) that is operatively connected to said feedback path and to said second variable frequency oscillator, for synchronizing said changing of said frequency of said pulses in said feedback path.

3. An electrical device (160 or 190) which comprises:
    phase locking oscillator means (180 or 192), comprising a loop (12) with a forward path (14) and a feedback path (16), and comprising a comparator (26) in said forward path that is operatively coupled to a control input (21) of a first variable frequency oscillator (22), for phase locking said forward and feedback paths to an input frequency;

said feedback path extending between an output (23) of said variable frequency oscillator and an input (29) of said comparator; and D.C. modulator means (182 or 194), comprising a resistor (166) that is interposed into said feedback path, and comprising a second variable frequency oscillator (64) that is operatively connected to said resistor, for resistively preventing a change in signal level in said feedback path.

4. An electrical device (100, 140, 160, or 190) which comprises:

reference frequency oscillator means (24) for supplying a reference frequency;

phase locking oscillator means (128, 154, 180, or 192), being connected to said reference frequency oscillator means, and comprising a loop (12) with a forward path (14) and a feedback path (16), and comprising a comparator (26) in said forward path that is operatively connected to a control input (21) of a variable frequency oscillator (22), for phase locking said loop to said reference frequency;

said feedback path extending between an output (23) of said variable frequency oscillator and an input (29) of said comparator;

D.C. modulator means (130, 156, 182, or 194), being operatively connected to said feedback path, for D.C. modulating the frequency in said feedback path; and means (48), being operatively connected to said feedback path, for channelizing the frequency of said phase locking oscillator means.

5. An electrical device (100, 140, 160, or 190) as claimed in claim 4 in which said device comprises means (84), being connected to said forward path (14), for D.C. modulating said forward path substantially simultaneously with said modulating of said feedback path (16).

6. An electrical device (80, 100, 140, 160, or 190) as claimed in claim 1 in which said device comprises means, being connected to said forward path (14), for D.C. modulating said forward path (14).

7. An electrical device (60, 80, 100, or 140) as claimed in claim 1 or 6 in which said phase locking oscillator means (70, 90, 128, or 154) comprises an integrator (20) that is disposed in said forward path intermediate of said variable frequency oscillator (22) and said comparator (26).

8. An electrical device (60, 80, 100, or 140) as claimed in claims 1 or 6 in which said D.C. modulator means (72, 92, 130, or 156) comprises means (34, 64) for adding pulses to said feedback path (16).

9. An electrical device (60, 80, 100, 140, 160, or 190) as claimed in claims 1 or 6 in which said D.C. modulator means (72, 92, 130, 156, 182, or 194) comprises means (34, 64, 142, 166, 168, and/or 178) for removing pulses from said feedback path (16).

10. An electrical device (60, 80, 100, 140, 160, or 190) as claimed in claims 1 or 6 in which said D.C. modulator means (72, 92, 130, 156, 182, or 194) comprises a modulation oscillator (64) that is operatively attached to said feedback path (16), and means (34, 142, 166, 168, and/or 178) for changing the frequency in said feedback path (16) as a function of the frequency of said modulation oscillator.

11. An electrical device (60, 80, 100, 140, or 190) as claimed in claims 1 or 6 in which said D.C. modulator means (72, 92, 130, 156 or 194) comprises means (34, 36, and/or 142), including a modulation oscillator (64) that is operatively connected to said feedback path (16), for changing the frequency in said feedback path by a plurality of pulses for each cycle of the frequency of said modulation oscillator.

12. An electrical device (60, 80, 100, or 140) as claimed in claims 1 or 6 in which said D.C. modulator means (72, 92, 130, or 156) comprises:

a dual modulus divider (34) being disposed in said feedback path (16) and having lower and higher dividing ratios; and means, comprising a modulation oscillator (64) that is operatively connected to said dual modulus divider, for controlling the frequency at which said dual modulus divider divides at one of said ratios.

13. An electrical device (160 or 190) as claimed in claims 1 or 6 in which said D.C. modulator means (182 or 194) comprises a modulation oscillator (64), a resistor (166) that is interposed into said feedback path (16), and a diode (168) that is operatively connected to both said modulation oscillator and said feedback path (16).

14. An electrical device (60, 80, 100, 140, 160, or 190) as claimed in claims 1 or 6 in which said D.C. modulator means (72, 92, 130, 156, 182, or 194) comprises modulation oscillator means (64) for providing modulation frequencies; and said synchronizer means (62) comprises a first flip-flop (102) that is connected to said modulation oscillator means, and a second flip-flop (104 or 164) that is operatively connected to said first flip-flop and to said feedback path (16).

15. An electrical device (140 or 190) as claimed in claims 1 or 6 in which said D.C. modulator means (194) comprises means, comprising a resistor (166) that is operatively connected to said feedback path (16), for resistively removing pulses from said feedback path (16).

16. An electrical device (140) as claimed in claims 1 or 6 in which said D.C. modulator means (156) comprises:

a dual modulus divider (34) that is disposed in said feedback path (16) and that divides at lower and higher ratios;

a modulation oscillator (64); and means, comprising a shift register (142) that is operatively connected to said modulation oscillator and to said dual modulus divider, for removing a plurality of pulses from said feedback path (16) for each cycle of the frequency of said modulation oscillator.

17. An electrical device (100, 140, or 190) as claimed in claims 1 or 6 in which said device comprises a dual modulus divider (34) having lower and higher dividing ratios, and being disposed in said feedback path (16);

said D.C. modulator means (130, 156, or 194) comprises first means (64) for controlling said dividing ratios; and said device comprises second means (48) for controlling said dividing ratios.

18. An electrical device (100, 140, or 190) as claimed in claims 1 or 6 in which said device comprises a dual modulus divider (34) having lower and higher dividing ratios, and being disposed in said feedback path (16);

said D.C. modulator means (130, 156, or 194) comprises first controlling means (64) for controlling said dividing ratios;
said device comprises second controlling means (48) for controlling said dividing ratios; and
said device comprises means (50) for preventing simultaneous control of said dividing ratios by said first and second controlling means.

19. An electrical device (80, 100, 140, 190) as claimed in claim 1 in which said device comprises a prescaling divider (36) being interposed into said feedback path (16).

20. A method for controlling the output frequency of a loop with a forward path that includes a comparator and a variable frequency oscillator that is operatively connected to said comparator, and with a feedback path that feeds a feedback frequency back from said variable frequency oscillator to an input of said comparator, which method comprises:
   a) D.C. modulating said feedback path;
   b) phase locking said loop to an input frequency substantially simultaneous to said D.C. modulating step; and
   c) synchronizing said D.C. modulating step with said feedback frequency.

21. A method for controlling the output frequency of a loop that includes both a forward path and a feedback path, said forward path including a comparator (26) that is connected to a control input of a variable frequency oscillator (22), and said variable frequency oscillator supplying feedback pulses through said feedback path to an input of said comparator, which method comprises:
   a) providing an input frequency;
   b) phase locking said loop to said input frequency;
   c) generating modulation frequencies;
   d) changing said pulses in said feedback path as a function of said modulation frequencies; and
   e) synchronizing said changing step with said feedback pulses.

22. A method for controlling the output frequency of a loop that includes both a forward path and a feedback path, said forward path including a comparator (26) that is connected to a control input of a variable frequency oscillator (22), and said variable frequency oscillator supplying a feedback frequency through said feedback path to an input of said comparator, which method comprises:
   a) providing a modulating frequency;
   b) using said modulating frequency to D.C. modulate the frequency in said feedback path;
   c) providing an input frequency;
   d) phase locking said loop to said input frequency substantially simultaneously with said D.C. modulating step; and
   said D.C. modulating step comprises resistively preventing a change in signal level in said feedback path as a function of said modulating frequency.

23. A method for controlling the output frequency of a loop that includes both a forward path and a feedback path, said forward path including a comparator (26) that is connected to a control input of a variable frequency oscillator (22), and said variable frequency oscillator supplying a feedback frequency through said feedback path to an input of said comparator, which method comprises:
   a) generating modulation frequencies;
   b) providing a reference frequency;
   c) phase locking said forward and feedback paths to said reference frequency;
   d) using said modulation frequencies to D.C. modulate said frequency in said feedback path as a function of said modulation frequencies; and
   e) channelizing said output frequency.

24. A method as claimed in claim 23 in which said method further comprises D.C. modulating said forward path.

25. A method as claimed in claim 20 in which said method further comprises D.C. modulating said forward path.

26. A method as claimed in claims 20 or 25 in which said D.C. modulating step comprises dividing the frequency in said feedback path by lower and higher dividing ratios.

27. A method as claimed in claims 20 or 25 in which said D.C. modulating step comprises adding pulses to said feedback path.

28. A method as claimed in claims 20 or 25 in which said D.C. modulating step comprises resistively preventing a change in the signal level in said feedback path.

29. A method as claimed in claims 20 or 25 in which said D.C. modulating step comprises removing pulses from said feedback path.

30. A method as claimed in claims 20 or 25 in which said D.C. modulating step comprises:
   a) generating modulation frequencies; and
   b) removing a plurality of pulses from said feedback path for each cycle of said modulation frequencies.

31. A method as claimed in claims 20 or 25 in which said D.C. modulating step comprises:
   a) generating modulation frequencies; and
   b) dividing the pulses in said feedback path by lower and higher ratios as a function of said modulation frequencies.

32. A method as claimed in claims 20 or 25 in which said D.C. modulating step comprises:
   a) dividing the pulses in said feedback path by lower and higher ratios as a function of a modulation frequency; and
   b) removing a plurality of pulses from said feedback path for each division of said pulses at one of said ratios.

33. A method as claimed in claims 20 or 25 in which said method further comprises:
   a) selectively controlling the frequency in said feedback path separately from said D.C. modulating step; and
   b) preventing interference between said D.C. modulating step and said selective controlling step.

34. A method as claimed in claim 20 in which said method further comprises prescaling the frequency in said feedback path.

35. A method as claimed in claims 20 or 25 in which said method further comprises preventing one cycle in said feedback path from transmitting a high.

36. A method as claimed in claims 20 or 25 in which said method further comprises holding a high between two adjacent cycles in said feedback path.

37. Signal processing apparatus (200) which comprises:
   input stage means (202) for receiving a frequency modulated input signal;
   an I.F. stage (203) comprising a local mixer (214), and comprising both a local oscillator (216) and an output conductor (218) that are operatively connected to said local mixer;

phase locking oscillator means (70, 90, 128, 154, 180, or 192), comprising a loop (12) with a forward path (14) that includes a comparator (26) and a variable frequency oscillator (22), and with a feedback path (16) that feeds a feedback frequency from said variable frequency oscillator back to an input of said comparator, for producing a phase locked output;

demodulator means (204), comprising both said I.F. stage and said phase locking oscillator means, and comprising both said I.F. stage and said phase locking oscillator means being operatively connected to said input stage means, for producing the D.C. component of said frequency modulated input signal in said output conductor;

D.C. modulator means (72, 92, 130, 156, 182, or 194), comprising a modulation oscillator (64) that produces modulation frequencies, and being operatively connected to said output conductor and to said feedback path, for D.C. modulating said phase locked output in response to said D.C. component; and said operative connection of said modulation oscillator to said feedback path comprises synchronizer means (62), being operatively connected to said modulation oscillator and to said feedback path, for synchronizing said D.C. modulating with said feedback frequency.

38. Signal processing apparatus (200) as claimed in claim 37 in which said operative connection of said D.C. modulator means (72, 92, 130, 156, 182, or 194) to said output conductor (218) comprises operative connection of said output conductor to said variable frequency oscillator (22) of said phase locking oscillator means (70, 90, 128, 154, 180, or 192).

39. Signal processing apparatus (200) as claimed in claims 37 or 38 in which said D.C. modulator means (72, 92, 130, 156, 182, or 194) comprises means (34, 36, 102, 104, 142, 164, 166, and/or 168), being operatively connected to said feedback path (16) and to said modulation oscillator (64), for removing pulses from said feedback path as a function of said modulation frequencies.

40. Signal processing apparatus (200) as claimed in claims 37 or 38 in which said D.C. modulator means (72, 92, 130, or 156) comprises means (34, 36, 102, 104, and/or 142), being operatively connected to said feedback path (16) and to said modulation oscillator (64), for increasing the frequency in said feedback path as a function of said modulation frequencies.

41. Signal processing apparatus (200) as claimed in claims 37 or 38 in which said D.C. modulator means (72, 92, 130, 156, or 194) comprises means (34, 36, 102, 104, 142, 166, and/or 168), being operatively connected to said feedback path (16) and to said modulation oscillator (64), for changing the frequency in said feedback path by a plurality of pulses for each cycle of said modulation frequencies.

42. Signal processing apparatus (200) as claimed in claims 37 or 38 in which said D.C. modulator means (72, 92, 130, or 156) comprises means (34, 36, 102, 104, 142, 166, and/or 168), being operatively connected to said feedback path (16) and to said modulation oscillator (64), for removing a plurality of pulses from said feedback path for each cycle of said modulation frequencies.

43. Signal processing apparatus (200) as claimed in claims 37 or 38 in which said D.C. modulator means (72, 92, 130, or 156) comprises divider means (34), being interposed into said feedback path (16), and being operatively connected to said modulation oscillator (64), for dividing the frequency in said feedback path by one of two dividing ratios as a function of said modulation frequencies.

44. Signal processing apparatus (200) as claimed in claims 37 or 38 in which said D.C. modulator means (130, 156, or 194) comprises:

divider means (34), being interposed into said feedback path (16), for dividing the frequency in said feedback path by lower and higher dividing ratios;

first controlling means, comprising said modulation oscillator (64) being operatively connected to said divider means, for controlling said dividing ratios as a function of said modulation frequencies; and second controlling means (48), being operatively connected to said divider means, for controlling said dividing ratios.

45. A method for processing electrical frequencies, which method comprises:

a) receiving a frequency modulated input;

b) generating a phase locked output by the steps of providing a reference frequency, using said reference frequency to generate an output frequency in a forward path, using said output frequency to provide a feedback frequency in a feedback path, comparing said feedback frequency with said reference frequency, and using said comparison to phase lock said output frequency;

c) mixing said phase locked output with said frequency modulated input to produce an I.F. input signal;

d) using said I.F. input signal to produce a demodulated output of said frequency modulated input;

e) using said demodulated output to D.C. modulate said feedback frequency; and f) synchronizing said D.C. modulating step with said feedback frequency.

46. A method as claimed in claim 45 in which said D.C. modulating step comprises using said demodulated output to D.C. modulate said forward path.

47. A method as claimed in claims 45 or 46 in which said step of D.C. modulating said feedback frequency comprises:

a) generating a modulation frequency that is lower than said output frequency; and b) changing the frequency of said feedback frequency as a function of said modulation frequency.

48. A method as claimed in claims 45 or 46 in which said step of D.C. modulating said feedback frequency comprises:

a) generating a modulation frequency that is lower than said output frequency; and b) removing pulses from said feedback frequency as a function of said modulation frequency.

49. A method as claimed in claims 45 or 46 in which said step of D.C. modulating said feedback frequency comprises:

a) generating a modulation frequency that is lower than said output frequency; and b) adding pulses to said feedback frequency as a function of said modulation frequency.

50. A method as claimed in claims 45 or 46 in which said step of D.C. modulating said feedback frequency comprises:

a) generating a modulation frequency that is lower than said output frequency; and b) changing a plurality of pulses of said feedback frequency for each cycle of said modulation frequency.

51. A method as claimed in claims 45 or 46 in which said step of D.C. modulating said feedback frequency comprises:
   a) generating a modulation frequency that is lower than said output frequency;
   b) dividing said feedback frequency by higher and lower dividing ratios;
   c) controlling said dividing ratios as a function of said modulation frequency; and
   d) channelizing said feedback frequency.

52. A method as claimed in claims 45 or 46 in which said step of D.C. modulating said feedback frequency comprises:
   a) generating a modulation frequency that is lower than said output frequency; and
   b) resistively preventing changes in signal level in said feedback path as a function of said modulation frequency.

53. An electrical device (80, 100, 140, 160, or 190) as claimed in claim 2 in which said device comprises means, being operatively connected to said first variable frequency oscillator (22), for changing the frequency of said first variable frequency oscillator (22) simultaneous to said changing of the frequency of said pulses in said feedback path (16).

54. An electrical device (160 or 190) as claimed in claim 3 in which said D.C. modulator means (182 or 194) comprises means, being operatively connected to said forward path (14), for D.C. modulating said forward path.

55. An electrical device (80, 100, 140, 160, or 190) as claimed in claims 1 or 6 in which said device comprises means (48, 50), being operatively connected to said feedback path (16), for channelizing said phase locked output.

56. An electrical device (100, 140, 160, or 190) as claimed in claims 1 or 6 in which said device comprises:
   means (48, 50), being operatively connected to said feedback path (16), for channelizing said phase locked output; and
   means (50, 62, 106, 144, 146) for preventing interference between said D.C. modulator means (130, 156, 182, or 194) and said channelizing means.

57. An electrical device (100, 140, 160, or 190) as claimed in claims 1 or 6 in which said device comprises means, including a variable modulus divider (48) that is operatively connected to said feedback path (16), for channelizing said phase locked output.

58. An electrical device (80, 100, 140, 160, or 190) as claimed in claim 2 in which said device comprises means (34), being operatively connected to said feedback path (16) and to said synchronizer (62), for channelizing said feedback path.

59. An electrical device (160 or 190) as claimed in claim 3 in which said device comprises channelizing means (48, 50), being operatively connected to said feedback path (16), for channelizing the output of said variable frequency oscillator (22) in said forward path (14) while said D.C. modulator means (182 or 194) D.C. modulates said output, and while said phase locking oscillator means (180 or 192) continues to phase lock said paths (14, 16) to said input frequency.

60. A method as claimed in claim 21 in which said method further comprises applying a modulating voltage to said forward path substantially simultaneous to said changing step.

61. A method as claimed in claim 22 in which said D.C. modulating step comprises D.C. modulating said forward path substantially simultaneous with said D.C. modulating of said feedback path.

62. A method as claimed in claims 20 or 25 in which said method further comprises channelizing said feedback frequency independently of said D.C. modulating step.

63. A method as claimed in claim 21 in which said method further comprises selectively changing said pulses in said feedback path separately from said changing of said pulses as a function of said modulation frequencies.

64. A method as claimed in claim 22 in which said method further comprises channelizing; and
   said channelizing step comprises selectively changing said feedback frequency separately from said D.C. modulating step.

65. Signal processing apparatus (200) as claimed in claims 37 or 38 in which said apparatus comprises means (48), being operatively connected to said feedback path (16), for channelizing said feedback frequency.

66. Signal processing apparatus (200) as claimed in claims 37 or 38 in which said apparatus comprises means (48), being operatively connected to said feedback path (16), for channelizing said feedback frequency; and
   said synchronizing means (62) comprises means (50, 62, 106, 144, 146) for preventing said channelizing means from interfering with said D.C. modulator means (92, 130, 156, 182, or 194).

67. Signal processing apparatus (200) as claimed in claims 37 or 38 in which said D.C. modulator means (182 or 194) comprises means (166) for resistively preventing a change in signal level in said feedback path (16).

68. A method as claimed in claims 45 or 46 in which said method further comprises channelizing said feedback frequency.

69. A method as claimed in claims 45 or 46 in which said method further comprises:
   a) channelizing said feedback frequency; and
   b) preventing interference between said D.C. modulating step and said channelizing step.

70. Signal processing apparatus (200) which comprises:
   input stage means (202) for receiving a frequency modulated signal;
   an I.F. stage (203) comprising a local mixer (214), a local oscillator (216) that is operatively connected to said local mixer, and an output conductor (218) that is operatively connected to said local mixer;
   phase locking oscillator means (70, 90, 128, 154, 180, or 192), comprising a forward path (14) that includes a comparator (26) and a variable frequency oscillator (22) that is operatively connected to said comparator, and comprising a feedback path (16) that feeds back a feedback frequency from said variable frequency oscillator to an input of said comparator, for producing a phase locked output;
   an rf mixer (210) being operatively connected to said input stage means, to said I.F. stage, and to said phase locked output;
   D.C. modulator means, comprising a modulation oscillator (64) that is operatively connected to said output conductor and to said feedback path, for D.C. modulating said feedback path as a function of a signal in said output conductor; and said D.C. modulator means comprises synchronizer means (62) for synchronizing said D.C. modulating with said feedback frequency.

71. Signal processing apparatus (200) as claimed in claim 70 in which said apparatus comprises means, including said output conductor (218) being operatively connected to said variable frequency oscillator (22), for D.C. modulating said forward path (14).

72. Signal processing apparatus (200) as claimed in claims 70 or 71 in which said apparatus comprises means (48), being operatively connected to said feedback path (16), for channelizing said feedback frequency.

* * * * *

UNITED STATES PATENT AND TRADEMARK OFFICE
CERTIFICATE OF CORRECTION

PATENT NO. : 5,091,706

DATED : 25 February 1992

INVENTOR(S) : Lloyd L. Lautzenhiser

It is certified that error appears in the above-identified patent and that said Letters Patent is hereby corrected as shown below:

In column 9, "KHz" should be --kHz-- in lines 24, 26, 28, 33, 44, 49, and 50. In column 12, --a synchronizer 101 which consists of first and second-- should be inserted between "by" and "flip-flops" in line 34. In column 13, --includes-- should be inserted between "140" and "a" in line 51; "is included" should be --in a synchronizer 143-- in line 52; and "synchronizing means" should be --synchronizer 143-- in line 53. In column 15, --Further, the flip-flops 102 and 164 cooperate with the diode 168 and the resistor 166 to provide a synchronizer 184.-- should be added after "84." in line 58. In column 17, --A synchronizer 196 of the FIGURE 9 embodiment includes the flip-flops, 102 and 104, the resistor 166, and the diode 168. The synchronizer 196 cooperates with the modulus control conductor 126 to provide the synchronizing function, as described previously.-- should be added after the period in line 27. In column 18, a comma should be added after "210" in line 45; "218; and the modulator 130 uses the demodulated output signal to D.C. modulate the phase locked signal, thereby modulating the output signal of the conductor 218." should be --218. That is, the D.C. modulator 130 uses the output signal in the output conductor 218 to D.C. modulate the phase locked signal. Therefore, the signal in the output conductor 218 is the demodulated output.-- in lines 47-51; and --, the D.C. modulated phase locked oscillator 100 may have an output frequency in the range of 1700-1900 MHz,-- should be added between "range" and "and" in line 53.

Signed and Sealed this

Twenty-eighth Day of June, 1994

Attest:

BRUCE LEHMAN

*Attesting Officer*   *Commissioner of Patents and Trademarks*